United States Patent
Tejnil et al.

(10) Patent No.: US 7,438,997 B2
(45) Date of Patent: *Oct. 21, 2008

(54) IMAGING AND DEVICES IN LITHOGRAPHY

(75) Inventors: Edita Tejnil, San Carlos, CA (US); Yan Borodovsky, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 466 days.

This patent is subject to a terminal disclaimer.

(21) Appl. No.: 10/846,403

(22) Filed: May 14, 2004

(65) Prior Publication Data

US 2005/0255388 A1    Nov. 17, 2005

(51) Int. Cl.
  *G03F 1/14*   (2006.01)
  *G03F 1/00*   (2006.01)
(52) U.S. Cl. .......................................... 430/5
(58) Field of Classification Search ................ 430/5
   See application file for complete search history.

(56) References Cited

U.S. PATENT DOCUMENTS

| | | | |
|---|---|---|---|
| 5,300,786 A | 4/1994 | Brunner et al. | |
| 5,446,521 A | 8/1995 | Hainsey et al. | |
| 5,541,026 A | 7/1996 | Matsumoto | |
| 5,578,402 A * | 11/1996 | Watanabe | 430/5 |
| 5,633,102 A * | 5/1997 | Toh et al. | 430/5 |
| 5,663,102 A | 9/1997 | Park | |
| 5,840,447 A | 11/1998 | Peng | |
| 5,932,376 A | 8/1999 | Liu et al. | |
| 6,440,616 B1 | 8/2002 | Izuha et al. | |
| 6,541,165 B1 | 4/2003 | Pierrat | |
| 6,623,895 B2 | 9/2003 | Chen et al. | |
| 6,994,940 B2 | 2/2006 | Nakao | |
| 7,033,708 B2 * | 4/2006 | Tejnil | 430/5 |
| 2001/0003026 A1 | 6/2001 | Lin et al. | |
| 2002/0132173 A1 | 9/2002 | Rolfson | |
| 2003/0039893 A1 * | 2/2003 | Farnsworth et al. | 430/5 |
| 2003/0219096 A1 | 11/2003 | Sewell | |
| 2004/0029023 A1 | 2/2004 | Misaka | |

FOREIGN PATENT DOCUMENTS

EP     0 090 924     10/1983

(Continued)

OTHER PUBLICATIONS

Gordon, R., et al., "Design and analysis of manufacturable alternating phase-shifting masks", *Proc. SPIE—The International Society for Optical Engineering*, vol. 3546, pp. 606-616, 18th Annual BACUS Symposium on Photomask Technology and Management, Brian J. Grenon; Frank E. Abboud; Eds. (Dec. 1998).

(Continued)

*Primary Examiner*—Mark F. Huff
*Assistant Examiner*—John Ruggles
(74) *Attorney, Agent, or Firm*—Fish & Richardson P.C.

(57) ABSTRACT

Systems and techniques for lithography. In one aspect, a method includes producing a microelectronic device by modulating an intensity and a phase of the zero diffraction order of a radiation with a device including subwavelength features having a pitch dimension smaller than one wavelength of the radiation.

19 Claims, 20 Drawing Sheets

FOREIGN PATENT DOCUMENTS

TW 576947 2/2004
WO WO02/44817 6/2002

OTHER PUBLICATIONS

Rieger, M., et al., "Layout design methodologies for sub-wavelength manufacturing", *Proc. 38th Conf. Design Automation*, Annual ACM IEEE Design Automation Conference, Las Vegas, NV, USA, pp. 85-88 (2001).

Ronse, K., et al., Semiconductor Fabtech 10th Edition: Resolution Enhancement Techniques in Optical Lithography, pp. 241-244 (Feb. 2005).

Levinson, H., *Principles of Lithography*, SPIE—The International Society for Optical Engineering, p. 274, formula 8.18, (2001).

\* cited by examiner

IMAGING AND DEVICES IN LITHOGRAPHY

BACKGROUND

This description relates to imaging and to devices in lithographic systems, methods, and techniques.

Lithography is a process in which features are rendered on generally flat surfaces. The features can be rendered using lithography masks (also known as "reticles") that modulate the exposure of a workpiece surface by electromagnetic radiation. The image projected on the workpiece by mask-modulated radiation is stored as a latent image in photosensitive media. After additional processing, the latent image is transformed into features on the workpiece that are used in further processing. For example, such features can be used to form integrated circuits on semiconductor wafers.

Phase shifting systems, methods, and techniques used in lithography vary the phase of electromagnetic radiation propagating through the mask to improve image quality of the features patterned on the workpiece. These improvements can include increased spatial resolution of printed features, increased contrast, and improvements resulting from an increased depth of focus during printing.

Phase shifting is commonly implemented using phase shifting masks. Phase shifting masks act to change the phase of transmitted radiation and cause the interference effects that improve feature quality at the workpiece. Phase shifting masks generally include two or more regions that a given frequency of electromagnetic radiation traverses in a differing average number of wavelengths. When the radiation traverses such regions, the differing number of optical wavelengths changes the phase relationship of the transmitted radiation. Using appropriate mask layout techniques, these changes in phase relationship can yield the improvements described above.

Two categories of phase shifting masks include alternating phase shifting masks and embedded phase shifting masks. Alternating phase shifting masks generally include two or more associated apertures with different transmissive properties. In particular, radiation from a first of the aperture(s) generally arrives at a given point at a workpiece with a phase differential relative to radiation from a second aperture. The apertures can be associated so that the phase differential results in interference effects that improve the quality of the printing.

Alternating phase shifting masks can include a phase shifter with a refractive index that is higher or lower than the bulk of the mask. The phase shifter can increase or decrease the average number of optical wavelengths along an optical path through a selected mask aperture to modulate the phase relative to other transmitted radiation. A phase shifter in a traditional alternating mask causes a minimal or no change to the intensity of such radiation relative to the intensity of radiation passing along other optical paths. Traditionally, alternating 180° phase shifting masks are produced by etching portions of the bulk of a mask substrate to a predetermined depth. Mask substrates are commonly selected to be highly transmissive to a chosen frequency of electromagnetic radiation.

FIG. 1 shows a theoretical radiation intensity distribution 100 of an image formed using an alternating phase shifting masks. Radiation intensity distribution 100 can be obtained using a phase shifting grating with equal width opaque lines and transparent spaces. Every other transparent space transmits electromagnetic radiation 180° out of phase from the light transmitted through the other transparent spaces. Radiation intensity distribution 100 includes points 105, 110 which are midway between adjacent spaces and where the radiation intensity is near zero where the electric field of the transmitted radiation changes sign.

Embedded phase shifting masks generally include regions that reduce the relative intensity of transmitted radiation while simultaneously changing the phase relationship of the reduced intensity radiation relative to other transmitted radiation. Such regions can include, e.g., thin films including chrome, $Cr_xO_y$, $Cr_xO_yN_z$, $Mo_xSi_yO_z$, or $Mo_xSi_yO_zN_q$. Embedded phase shifting masks are also known as attenuated phase shifting masks or transmission-π masks.

Other example categories of masks include alternating aperture phase shifting masks (PSM), hidden shifter PSM, exposed shifter PSM, chromeless PSM (phase-edge PSM), chromeless shifter-shutter, high transmission embedded PSM, leaky chrome PSM, and rim shifter masks.

DESCRIPTION OF DRAWINGS

Like reference symbols in the various drawings indicate like elements.

DETAILED DESCRIPTION

Figure 1:
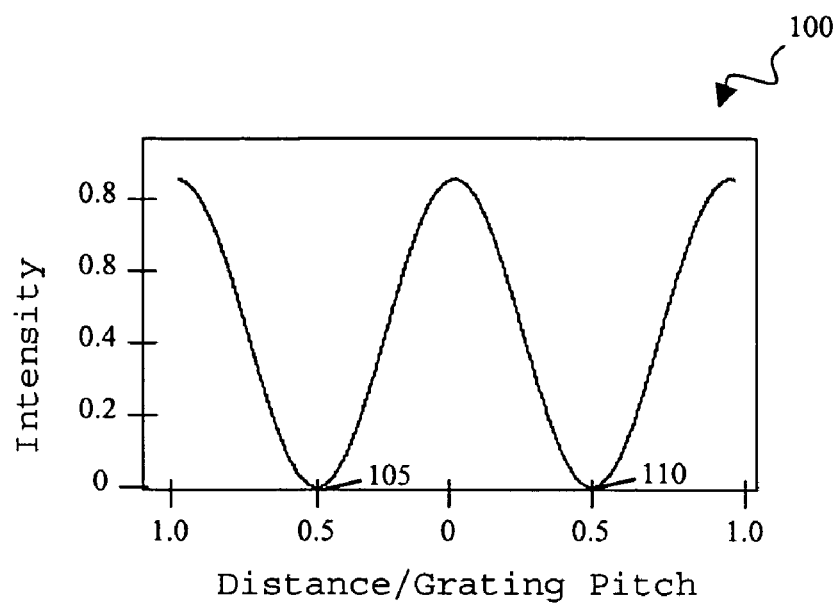
FIG. 1 shows a theoretical radiation intensity distribution of an image formed using an alternating phase shifting mask.
Figure 2:
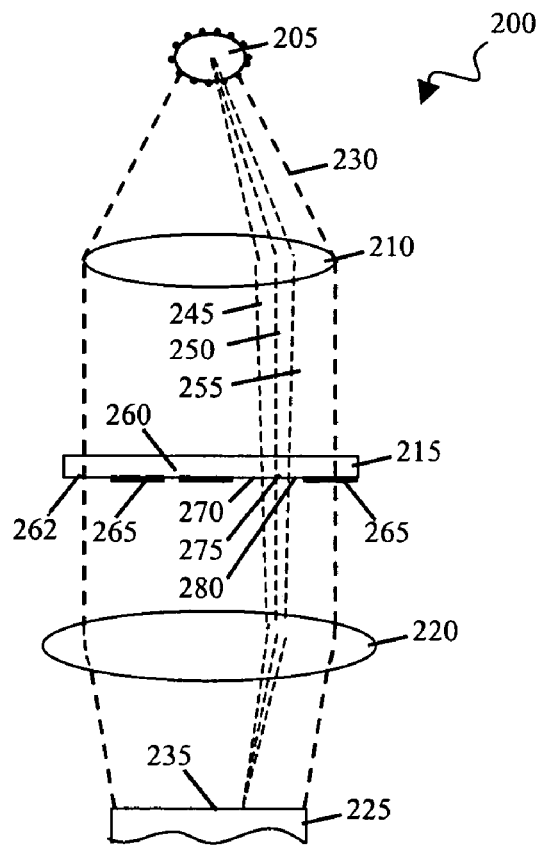
FIG. 2 shows a block diagram of a lithography system.

FIG. 2 shows a photolithography system 200. System 200 includes an illumination source 205, an illumination system 210, a mask 215, an imaging system 220, and a substrate 225.

Illumination source 205 generates electromagnetic radiation 230. Radiation 230 can be fully or partially coherent in that the emitted optical waves maintain a fixed and predictable phase relationship with each other for a period of time. Radiation 230 can be selected for use in lithographic patterning of microelectronic devices. For example, radiation 230 can be ultraviolet or deep ultraviolet radiation, such as 193-nm radiation.

Illumination system 210 can include an aperture, a condenser, as well as additional devices for collecting, collimating, filtering, and focusing radiation 230 emitted from source 205.

Imaging system 220 can include an aperture, an objective, as well as additional devices, for collecting, filtering, and focusing the portion of radiation 230 that passes through mask 215 onto substrate 225. For example, imaging system 220 can include a filtering projection lens.

Substrate 225 is a workpiece to be patterned by system 200. Substrate 225 includes a working surface 235. Substrate 225 can be presented to system 200 by a vacuum chuck or other support such that radiation 230 is focused on working surface 235. Substrate 225 can include a photosensitive resist material above a base material at working surface 235. The base material can be a generally planar wafer that includes one or more of an electrical insulator such as silicon dioxide or nitride, a semiconducting material such as p- or n-doped silicon, or a conducting material such as copper or aluminum. The base of substrate 225 can be patterned to form all or a portion of a microelectronic device. The resist material can be a material that is sensitive to radiation 230. For example, the resist material can be a planar film of positive or negative photoresist.

Mask 215 is positioned in system 200 by a mask stage to influence the incidence of radiation 230 upon substrate 225. Mask 215 can include different regions that transmit electromagnetic radiation with different transmissivities and phases. For example, mask 215 can be a phase shifting mask in that it is operable to change the phase relationship between optical waves in radiation 230 upon transmission through mask 215. For example, mask 215 can change the phase relationship between a first optical wave traveling along a first optical path 245, a second optical wave traveling along a second optical path 250, and a third optical wave traveling along a third optical path 255. These changes to the phase relationship can be designed to improve the quality of features printed at working surface 235 of substrate 225. Mask 215 can include phase shifting regions that transmit substantially equal intensity radiation or that transmit different intensity radiation, as discussed further below.

Mask 215 can include a mask substrate 260, one or more opaque areas 265, a first phase shifting region 270, a second phase shifting region 275, and a bulk mask substrate region 280. Mask substrate 260 has a surface 262 where areas 265 and regions 270, 275, 280 are located. Mask substrate 260 generally includes a material that is largely transparent to radiation 230. For example, mask substrate 260 can be a glass or fused silica sheet.

Opaque areas 265 may block the transmission of radiation 230 along selected optical paths through mask 215. These paths are not designated in FIG. 2. Opaque areas 265 can be made, e.g., from chrome or other materials. Mask 215 need not include any opaque area 265.

Regions 270, 275, 280 may be operable to change the phase relationship of transmitted optical waves. In particular, regions 270, 275, 280 may each shift the phase of radiation traveling along the respective of paths 245, 250, 255 to a different extent. The magnitude of the phase shifts is determined by parameters such as the geometry, the dimensions, and the effective refractive index of regions 270, 275, 280, as discussed further below. Regions 270, 275, 280 can be adjacent to one another or regions 270, 275, 280 can be separated from one another. Additional regions that change the phase relationship of transmitted radiation to the same or different extents can be located at surface 262.

In some implementations, regions 270, 275, 280 do not substantially change the intensity of transmitted radiation. In other implementations, regions 270, 275, 280 may attenuate the intensity of transmitted radiation to different extents. In particular, regions 270, 275, 280 may each change the intensity of radiation traveling along the respective paths 245, 250, 255 to different extents. The magnitudes of the attenuation are determined by parameters such as the geometry, the dimensions, and the effective refractive index of regions 270, 275, 280, as discussed further below. Regions 270, 275, 280 can be adjacent to one another or regions 270, 275, 280 can be separated from one another. Additional regions that attenuate the intensity of transmitted radiation to the same or different extents can be located at surface 262.

Since regions 270, 275, 280 can each shift the phase of radiation to a different extent, three different phases can be obtained in radiation 230 transmitted through mask 215. Additional regions can provide additional phases.

Figure 3:
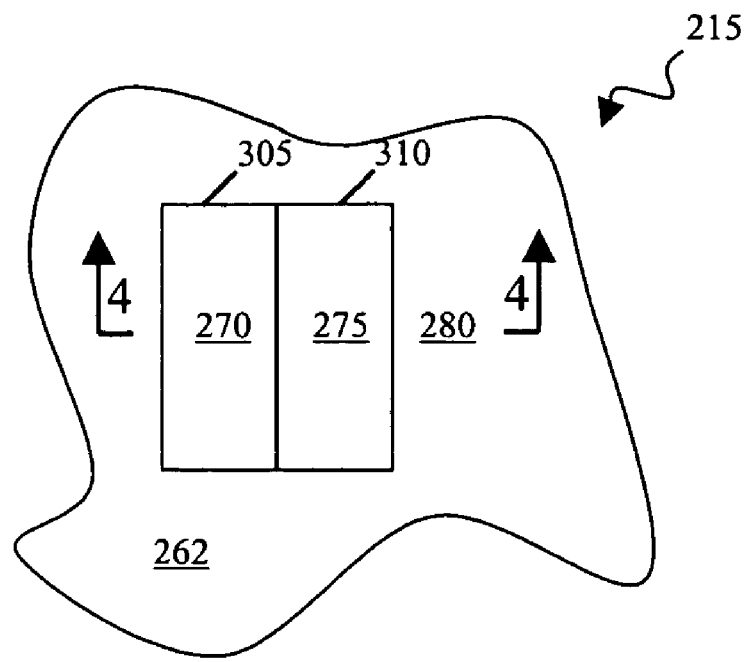
FIGS. 3 and 4 show an implementation of a mask.
Figure 4:
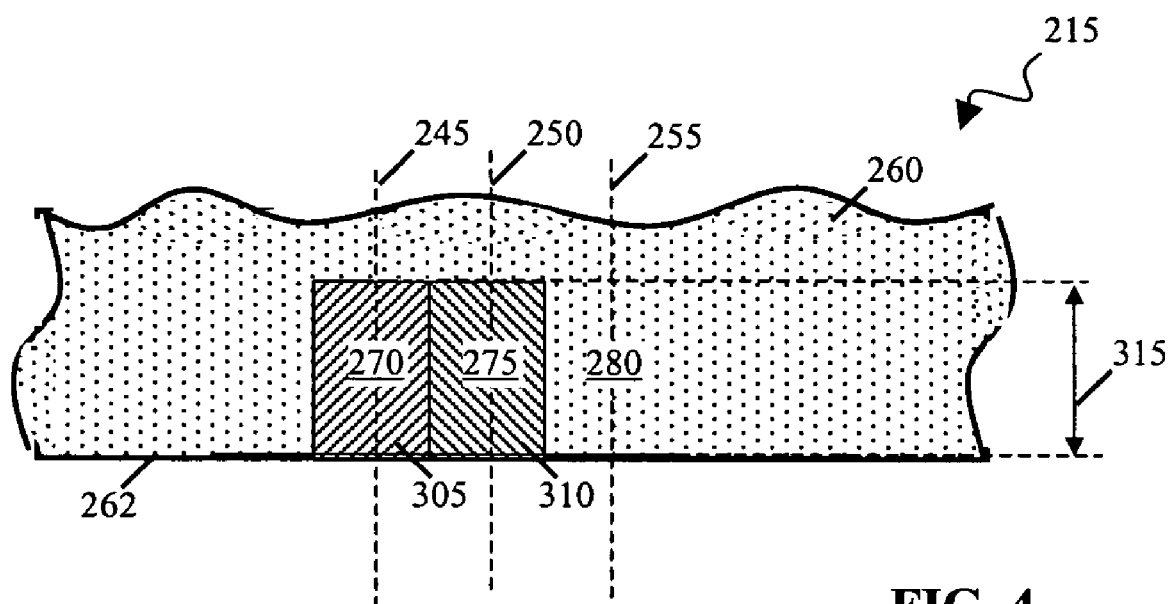

FIGS. 3 and 4 show an implementation of surface 262 of mask 215 in increased detail. FIG. 3 shows surface 262 of mask 215 from below, while FIG. 4 shows mask 215 along section 4-4. First phase shifting region 270 includes a first etched phase shifter 305. Second phase shifting region 275 includes a second etched phase shifter 310. Bulk mask substrate region 280 does not include an etched phase shifter but is instead an extension of mask substrate 260.

Phase shifters 305, 310 each shift the phase of radiation traveling along the respective of paths 245, 250 to a different extent than region 280 shifts the phase of radiation traveling along path 255. In some implementations, phase shifters 305, 310 each have different effective refractive indices that are between the refractive index of region 280 and the refractive index of the surrounding medium. As a result of these differences in effective refractive index, the same frequency radiation traveling along paths 240, 250, 255 may require a different number of optical wavelengths to traverse mask 215. This optical path length difference can be engineered to shift the phase of such radiation to cause interference effects that improve the quality of features printed with mask 215 on a workpiece.

In some implementations, phase shifters 305, 310 can both extend a depth 315 from the level of surface 262 into mask 215. This facilitates the manufacture of mask 215, since phase shifters 305, 310 can be etched into mask substrate 260 using a single mask substrate etch operation.

Figure 5:
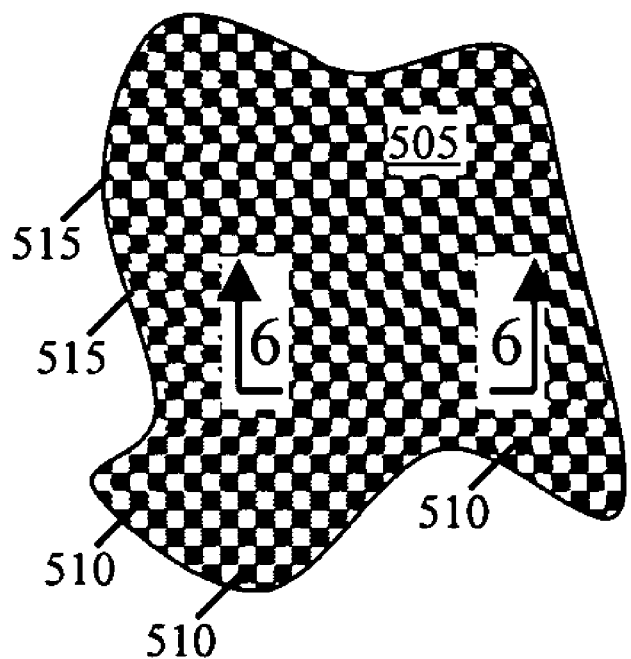
FIGS. 5-8 show implementations of a portion of phase shifters.
Figure 6:
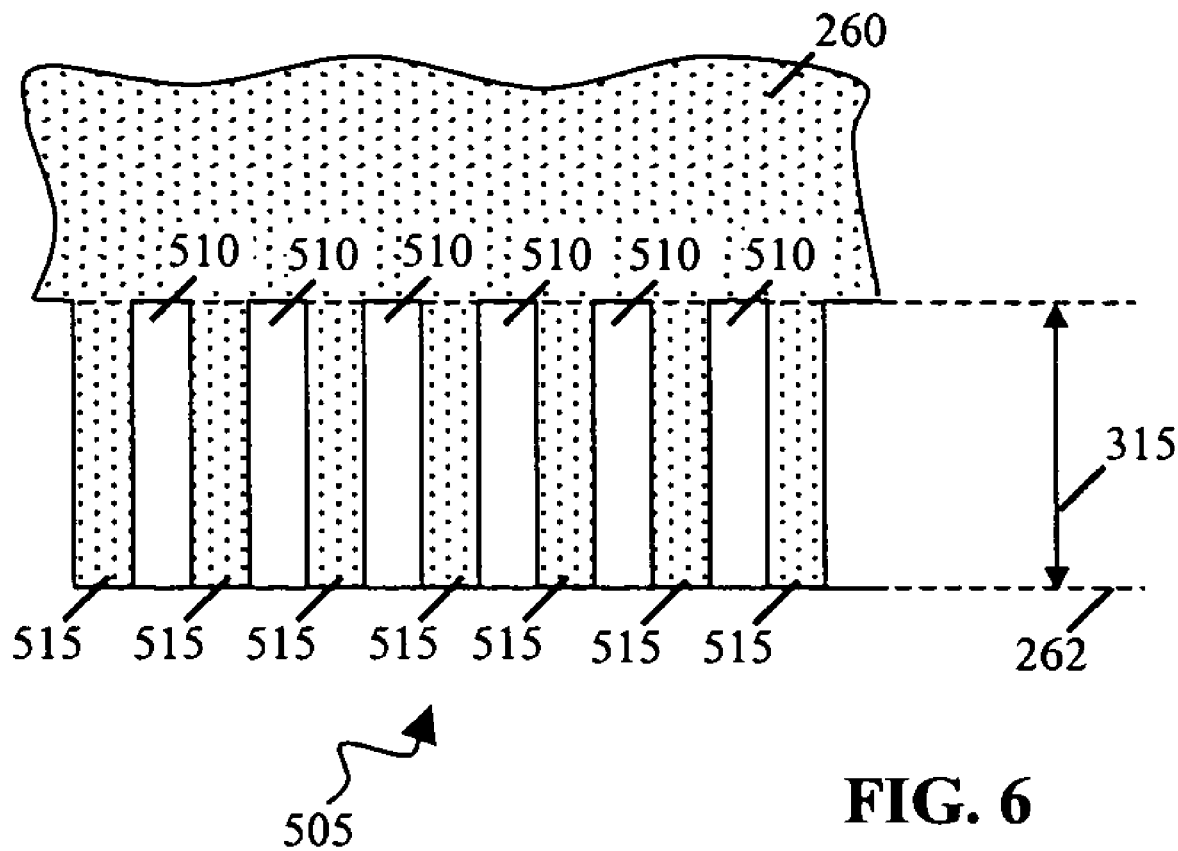

FIGS. 5-8 illustrate implementations of phase shifters that are engineered to cause interference effects that improve the quality of features printed with mask 215. FIGS. 5 and 6 show an implementation of a portion of a single phase shifter, such as either of phase shifters 305, 310 (FIG. 3). FIG. 5 shows a view of the phase shifter from below, while FIG. 6 shows the same phase shifter along section 6-6. The illustrated phase shifter includes a checkerboard pattern 505. Checkerboard pattern 505 includes a collection of holes 510 that are etched to depth 315 from the level of surface 262 to define a collection of columnar features 515.

Figure 7:
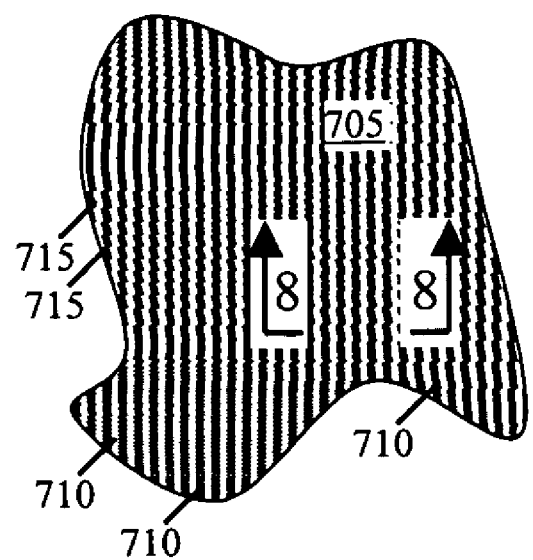
Figure 8:
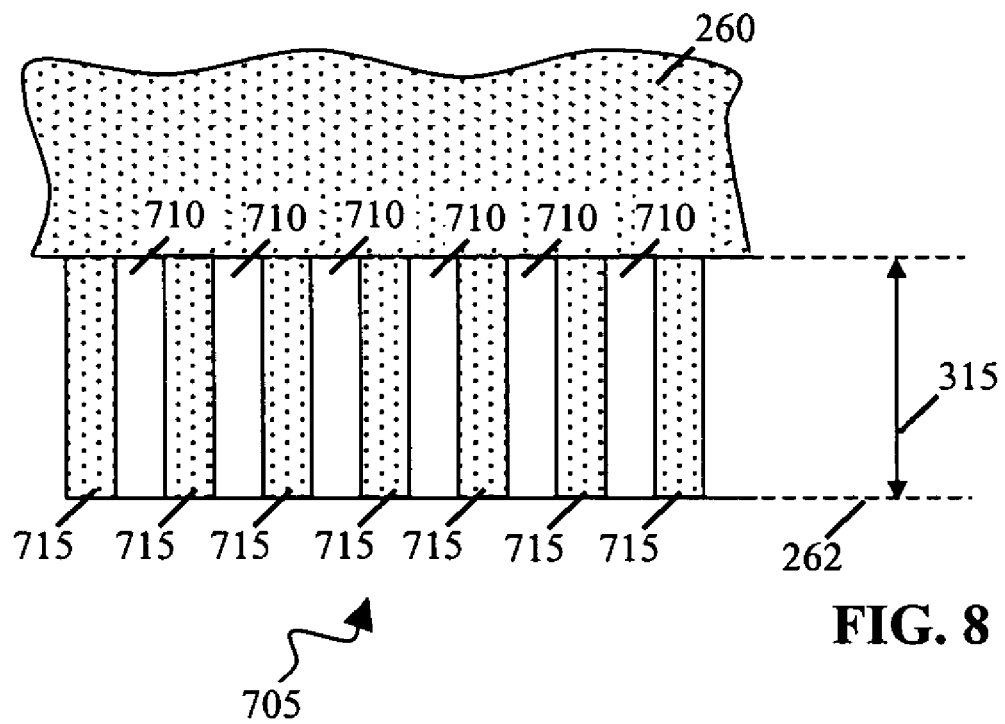

FIGS. 7 and 8 show another implementation of a portion of a single phase shifter, such as either of phase shifters 305, 310 (FIG. 3). FIG. 7 shows a view of the phase shifter from below, while FIG. 8 shows the same phase shifter along section 8-8. The illustrated phase shifter includes a grating pattern 705. Grating pattern 705 includes a collection of trenches 710 that are etched to depth 315 from the level of surface 262 to define a collection of line features 715.

Figure 9:
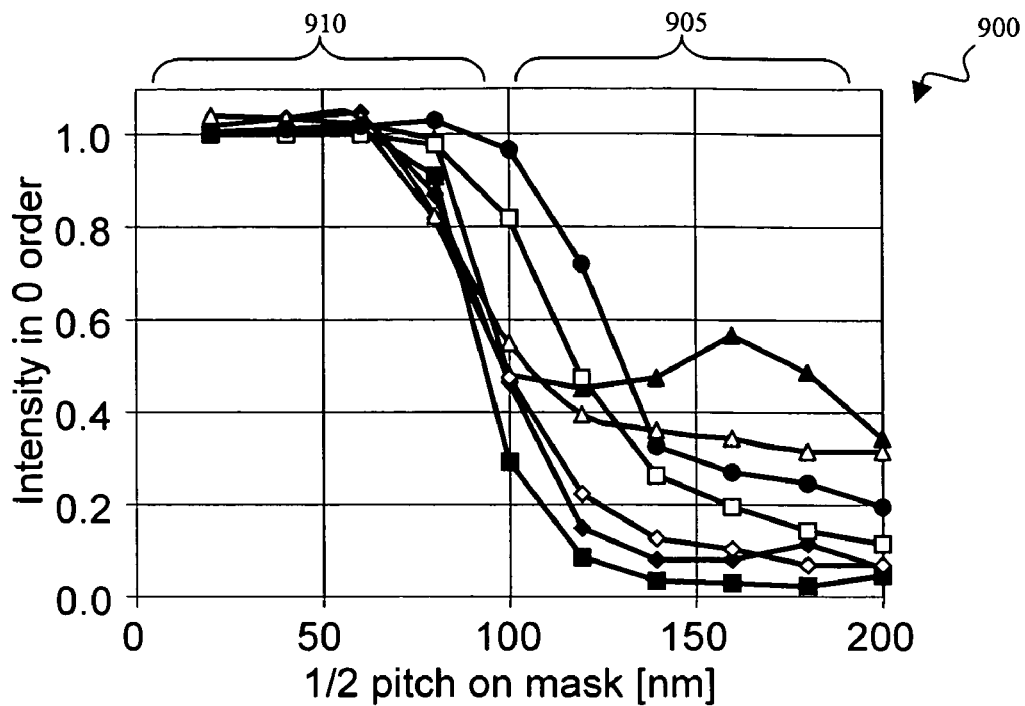
FIGS. 9, 10, and 11 illustrate how phase shifters can be tailored.
Figure 11:
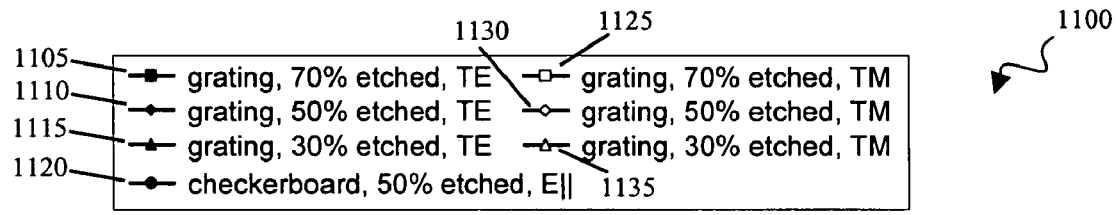
Figure 10:
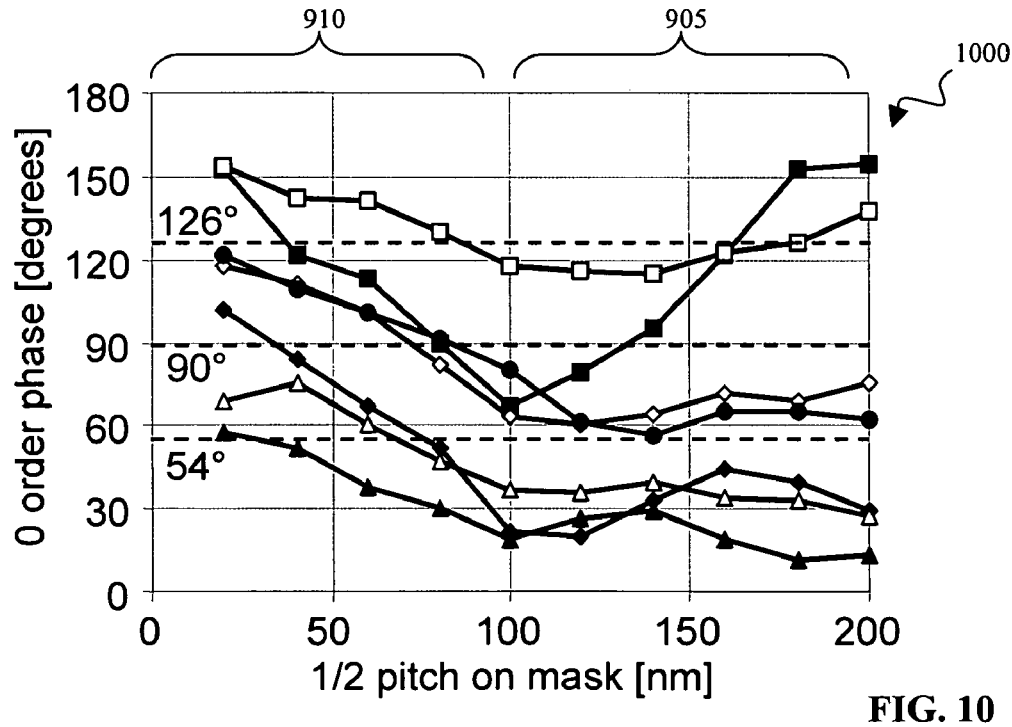

The layout of holes 510, trenches 710, and features 515, 715 can be selected to cause the desired interference effects and improve the quality of features printed with mask 215. FIGS. 9, 10, and 11 illustrate how to select the layout and duty ratio of holes 510, trenches 710, and features 515, 715 when depth 315 is the 180° etch depth (i.e., when depth 315 is given by the equation $$\lambda/2(n-1) \qquad \text{Equation 1}$$

where λ is the wavelength of radiation 230, n is the refractive index of features 515, 715, and the refractive index of the medium surrounding the mask is assumed to be one.).

FIG. 9 shows a graph 900 of the normalized near field zero diffraction order intensity of transmitted 193-nm radiation for a variety of phase shifters based on patterns 505, 705 as a function of one half the pitch of the phase shifters.

The zero diffraction order of the transmitted radiation is the electromagnetic field that is transmitted in the same orders are generally defined for periodic structures, for the purposes of this specification, the zero diffraction order refers to the electro-magnetic field that is transmitted through (or reflected by, in case the device is used in reflection mode) a given region of interest in the same direction as the direction of propagation of the undiffracted incoming radiation field. In transmission mode, the direction of propagation of the zero diffraction order is the direction in which the incoming radiation field would propagate in the absence of the device pattern. In reflection mode, the direction of propagation corresponds to the propagation direction of the specularly reflected radiation in the absence of the device pattern. The zero diffraction order can be described in terms of intensity and phase relative to other radiation transmitted through (or reflected by) a reference region of the device.

Pitch is the smallest spatial period within a region of interest on a device. Such a region may be as small as several wavelengths in lateral dimension or much larger. Thus, the pitch of a phase shifter is the smallest spatial period of the phase shifter. For example, the pitch of checkerboard pattern 505 is the sum of the width of a columnar feature 515 and the width of an adjacent hole 510. As another example, the pitch of grating pattern 705 is the sum of the width of a line feature 715 and the width of an adjacent trench 710.

In graph 900, the near field zero diffraction order intensity is normalized by the clear field intensity. The clear field of a mask is a transmissive area that does not include a phase shifter. Thus, the clear field intensity can be, e.g., the intensity of radiation transmitted through region 280 of mask 215. The pitch of patterns 505, 705 is expressed in nanometers.

FIG. 10 shows a graph 1000 of the zero diffraction order phase of transmitted 193-nm radiation for a variety of phase shifters based on patterns 505, 705 as a function of one half the pitch of the phase shifter. The zero diffraction order phase is the phase of radiation that is transmitted in the same direction as the direction of the incoming radiation. The zero diffraction order phase is given relative to the phase of radiation transmitted through a solid region of mask 215 (e.g., such as through region 280 along path 255 (FIG. 2)). In graph 1000, the zero diffraction order phase is expressed in degrees and the pitch of patterns 505, 705 is expressed in nanometers.

Graphs 900 and 1000 both include a scattering region 905 and an averaging region 910. Features in both of scattering region 905 and averaging region 910 are "subwavelength features" in that they have one or more dimensions in a vicinity of or smaller than one wavelength of the incident 193-nm radiation. However, in scattering region 905, a consequential portion of any 193-nm radiation incident on the phase shifter is scattered by the phase shifter out of the entrance pupil of projection optics used to print features (such as imaging system 220 (FIG. 2)). In averaging region 910, 193-nm radiation incident on the phase shifter is not significantly scattered into directions at large angles relative to the incident beam. This is a result of features 515, 715 (as well as holes 510 and trenches 710) having one or more dimensions in a vicinity of or smaller than one half a wavelength of the incident 193-nm radiation. Thus, features 515, 715 in averaging region 910 can be referred to as sub-half wavelength features. Such sub-half wavelength features can be formed using any of a number of high resolution printing techniques, such as electron beam printing, imprint techniques, ion-beam printing, and EUV and x-ray lithography.

As a result of the dimensions in averaging region 910, the optical properties of features 515, 715, holes 510, and/or trenches 710 are said to be "averaged" toward incident 193-nm radiation in the near field. Such averaging is not necessarily a strict arithmetic mean of the physical properties of the constituent features 515, 715, holes 510, and/or trenches 710. Rather, in averaging region 910, any incident 193-nm radiation interacts with patterns 505, 705 in the phase shifter as if patterns 505, 705 were a uniform whole rather than discrete features 515, 715, holes 510, and/or trenches 710.

FIG. 11 shows a key 1100 to graphs 900, 1000. Key 1100 indicates that graphs 900, 1000 include lines 1105, 1110, 1115, 1120, 1125, 1130, 1135. Line 1105 corresponds to a grating pattern 705 where the width of trenches 710 is 70% of the pitch of the grating pattern 705 and where trenches 710 are oriented parallel to the electric field of polarized incident radiation. Line 1110 corresponds to a grating pattern 705 where the width of trenches 710 is 50% of the pitch of the grating pattern 705 and where trenches 710 are oriented parallel to the electric field of polarized incident radiation. Line 1115 corresponds to a grating pattern 705 where the width of trenches 710 is 30% of the pitch of the grating pattern 705 and where trenches 710 are oriented parallel to the electric field of polarized incident radiation.

Line 1120 corresponds to a checkerboard pattern 505 where the width of holes 510 is 50% of the pitch of the checkerboard pattern 505 and where the electric field of transmitted radiation has substantially the same polarization as the electric field of the incident radiation.

Line 1125 corresponds to a grating pattern 705 where the width of trenches 710 is 70% of the pitch of the grating pattern 705 and where trenches 710 are oriented parallel to the magnetic field of polarized incident radiation. Line 1130 corresponds to a grating pattern 705 where the width of trenches 710 is 50% of the pitch of the grating pattern 705 and where trenches 710 are oriented parallel to the magnetic field of polarized incident radiation. Line 1135 corresponds to a grating pattern 705 where the width of trenches 710 is 30% of the pitch of the grating pattern 705 and where trenches 710 are oriented parallel to the magnetic field of polarized incident radiation.

As can be seen from FIGS. 9 and 10, the transmissivity and phase shift of radiation by phase shifters can be tailored to improve the quality of printing by selecting appropriate features for inclusion in the phase shifters. An individual can identify the desired modulation of a certain radiation and then identify appropriate features (and their layout) that can be used to achieve the desired modulation. Appropriate features can be identified by reference to graphs 900, 1000 (and other implementations described herein), by experimental investigation of these and other features, or by solution of the Maxwell equations governing the transmission of radiation through these and other features. For example, commercially available software for describing wave propagation in lithography (e.g., the EM-SUITE PACKAGE available from Panoramic Technologies, Inc., Berkeley, Calif.) can be used to identify such features. Further, the polarization of radiation can be controlled to provide additional control over the transmission characteristics of the phase shifters. Patterns (such as checkerboard pattern 505) that include non-polarizing features that interact with radiation 230 substantially independently of any polarization of radiation 230 can also be used.

Furthermore, given the results obtained with grating pattern 705, it is apparent that every dimension of a sub-half wavelength feature in a phase shifter need not be in a vicinity of one half a wavelength of the incident radiation or below. Rather, features with only sub-half wavelength pitch can provide advantageous results.

To the extent that two or more phase shifters are desired in a single mask, the individual can identify two or more classes of features that yield different phase shifts and different intensities. The identified classes of features can be incorporated into a single mask. Further, since the different phase shifts and intensities can be achieved with different phase shifters that are formed in a single phase etch operation (e.g., by etching differently laterally dimensioned holes to the same etch depth or by etching differently dimensioned trenches to the same etch depth), mask fabrication can be simplified. In particular, a multiphase mask can be formed using a single etch operation, obviating the need for repeated overlays and patterning operations during mask fabrication.

Such a simplification of the formation of multiphase masks can be used to produce multiphase masks that improve printed feature quality in any of a number of different ways. For example, hidden shifter phase shifter masks and exposed shifter phase shifter masks can be formed using a single phase etch operation. A single mask having both strong phase shifting regions and weak phase shifting regions can be formed. A wide range of phase shifts and attenuations can be achieved with simplified processing that reduces overlay and processing requirements.

Figure 12:
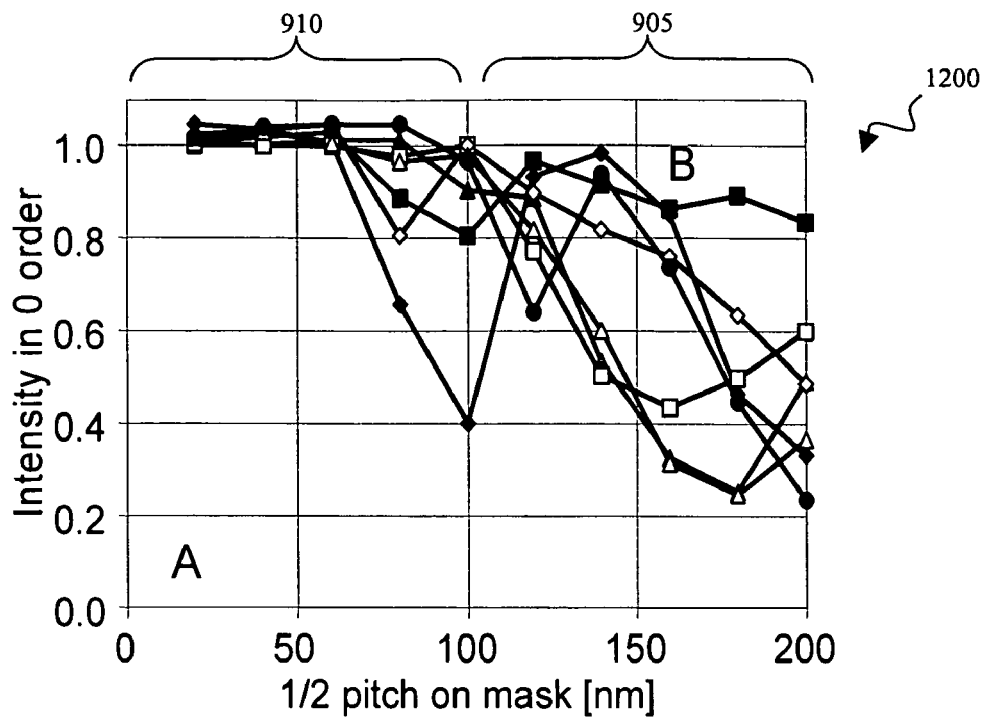
FIGS. 12, 13, and 14 illustrate how phase shifters can be tailored.
Figure 14:
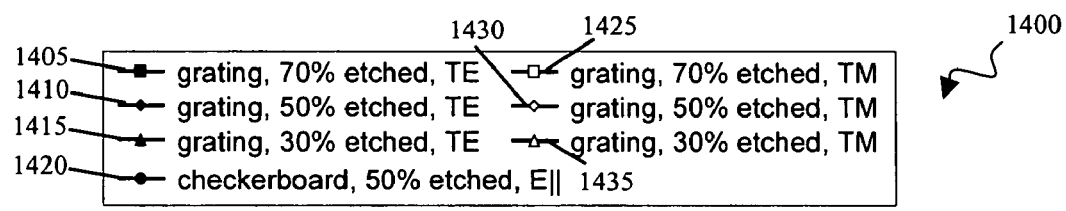
Figure 13:
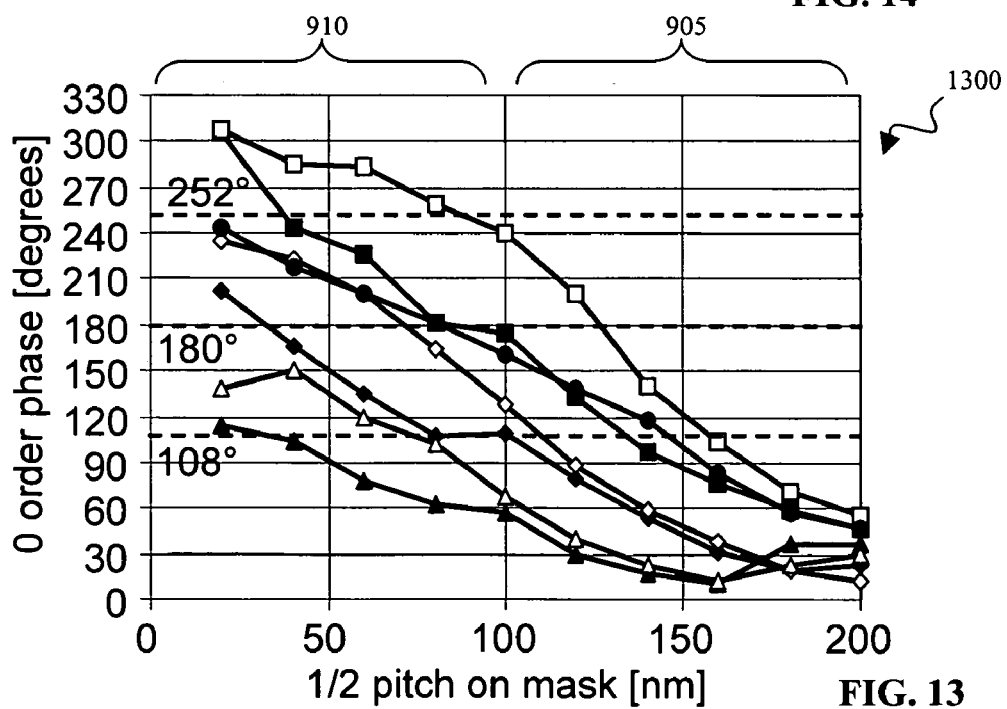

FIGS. 12, 13, and 14 illustrate another implementation of how the layout of holes 510, trenches 710, and features 515, 715 can be selected, namely, when depth 315 is the 360° etch depth (i.e., when depth 315 is given by the equation $$\lambda/(n-1) \qquad \text{Equation 2}$$

where λ is the wavelength of radiation 230, n is the refractive index of features 515, 715, and the refractive index of the medium surrounding the mask is assumed to be one.).

FIG. 12 shows a graph 1200 of the normalized zero diffraction order intensity of transmitted 193-nm radiation for a variety of phase shifters based on patterns 505, 705 as a function of one half the pitch of the phase shifters. In graph 1200, the zero diffraction order intensity is normalized by the clear field intensity and the pitch of patterns 505, 705 is expressed in nanometers.

FIG. 13 shows a graph 1300 of the zero diffraction order phase of transmitted 193-nm radiation for a variety of phase shifters based on patterns 505, 705 as a function of one half the pitch of the phase shifter. In graph 1300, the zero diffraction order phase is expressed in degrees and the pitch of patterns 505, 705 is expressed in nanometers. Graphs 1200 and 1300 both include a scattering region 905 and an averaging region 910.

FIG. 14 shows a key 1400 to graphs 1200, 1300. Key 1400 indicates that graphs 1200, 1300 include lines 1405, 1410, 1415, 1420, 1425, 1430, 1435. Line 1405 corresponds to a grating pattern 705 where the width of trenches 710 is 70% of the pitch of the grating pattern 705 and where trenches 710 are oriented parallel to the electric field of polarized incident radiation. Line 1410 corresponds to a grating pattern 705 where the width of trenches 710 is 50% of the pitch of the grating pattern 705 and where trenches 710 are oriented parallel to the electric field of polarized incident radiation. Line 1415 corresponds to a grating pattern 705 where the width of trenches 710 is 30% of the pitch of the grating pattern 705 and where trenches 710 are oriented parallel to the electric field of polarized incident radiation.

Line 1420 corresponds to a checkerboard pattern 505 where the width of holes 510 is 50% of the pitch of the checkerboard pattern 505 and where the electric field of transmitted radiation has substantially the same polarization as the electric field of the incident radiation.

Line 1425 corresponds to a grating pattern 705 where the width of trenches 710 is 70% of the pitch of the grating pattern 705 and where trenches 710 are oriented parallel to the magnetic field of polarized incident radiation. Line 1430 corresponds to a grating pattern 705 where the width of trenches 710 is 50% of the pitch of the grating pattern 705 and where trenches 710 are oriented parallel to the magnetic field of polarized incident radiation. Line 1435 corresponds to a grating pattern 705 where the width of trenches 710 is 30% of the pitch of the grating pattern 705 and where trenches 710 are oriented parallel to the magnetic field of polarized incident radiation.

The transmissivity and the phase shift of radiation by phase shifters can be tailored to improve the quality of printing by selecting appropriate features for inclusion in the phase shifters. Two or more classes of features that yield different phase shifts and different intensities can be identified. The identified classes of features can be incorporated into a single mask. The different phase shifts and intensities can be achieved with different phase shifters formed in a single phase etch operation to produce a multiphase mask. Further, the polarization of radiation can be controlled to provide additional control over the transmission characteristics of the phase shifters, depending on the inclusion of polarizing or non-polarizing features in the mask.

Figure 15:
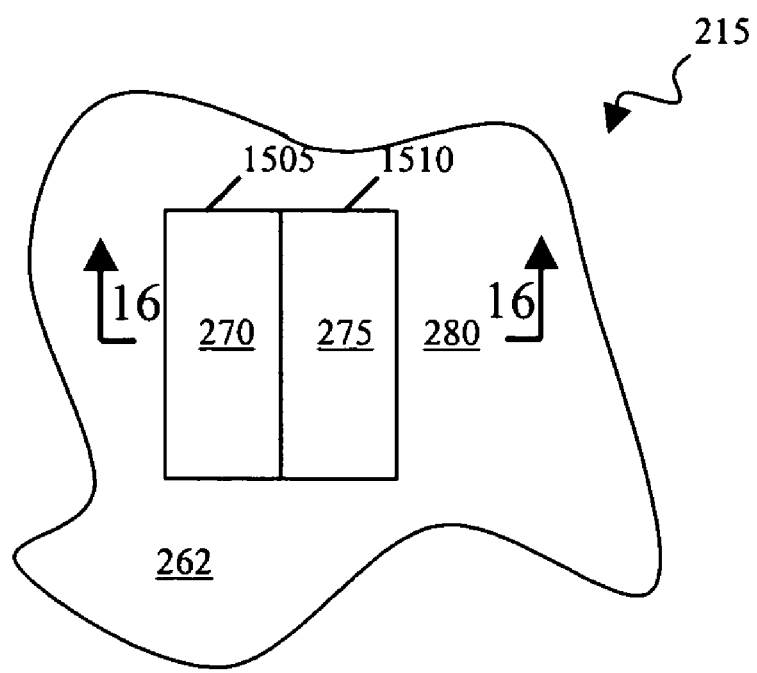
FIGS. 15 and 16 show an implementation of a mask.
Figure 16:
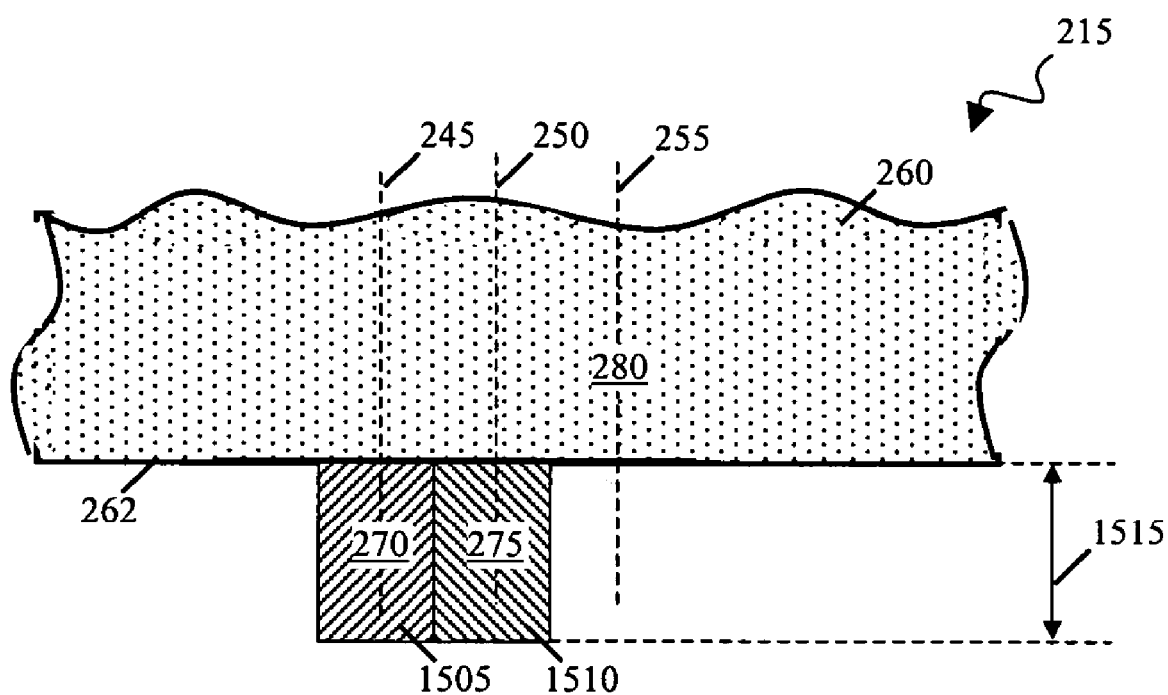

FIGS. 15 and 16 show an implementation of a surface 262 of mask 215 in increased detail. FIG. 15 shows surface 262 of mask 215 from below, while FIG. 16 shows mask 215 along section 16-16. First phase shifting region 270 includes a first phase shifter 1505. Second phase shifting region 275 includes a second phase shifter 1510. Third phase shifting region 280 does not include a phase shifter. Third phase shifting region 280 has the same refractive index as mask substrate 260, which is generally higher than the refractive index of the medium surrounding mask 215.

Phase shifters 1505, 1510 each shift the phase of optical waves traveling along the respective of paths 245, 250 to a different extent and different from the extent that region 280 shifts the phase of optical waves traveling along path 255. In particular, the same wavelength radiation traveling along paths 240, 250, 255 may require a different number of optical wavelengths to traverse mask 215.

In some implementations, phase shifters 1505, 1510 each also attenuate radiation 230 traveling along the respective of paths 245, 250 to a different amount and can form embedded phase shifting regions. In one such implementation, phase shifters 1505, 1510 can both have a same thickness 1515 and extend downward from the level of surface 262 of mask 215. This facilitates the manufacture of mask 215, since phase shifters 1305, 1310 can be formed easily. For example, phase shifters 1305, 1310 can be formed simultaneously using a single thin film deposition, masking, and etch operation.

Figure 17:
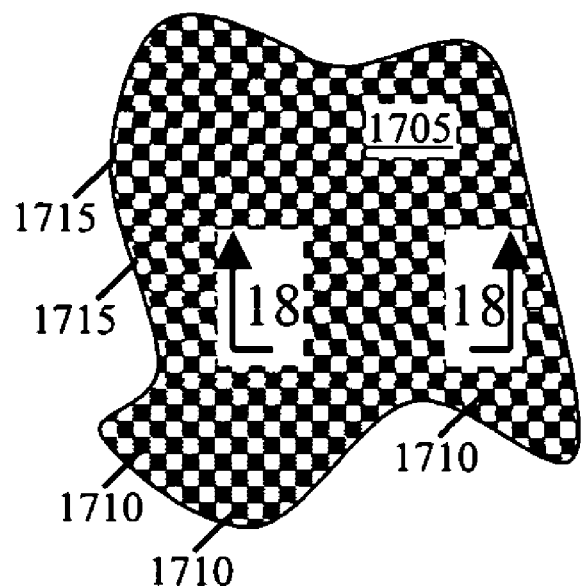
FIGS. 17-20 show implementations of a portion of phase shifters.
Figure 18:
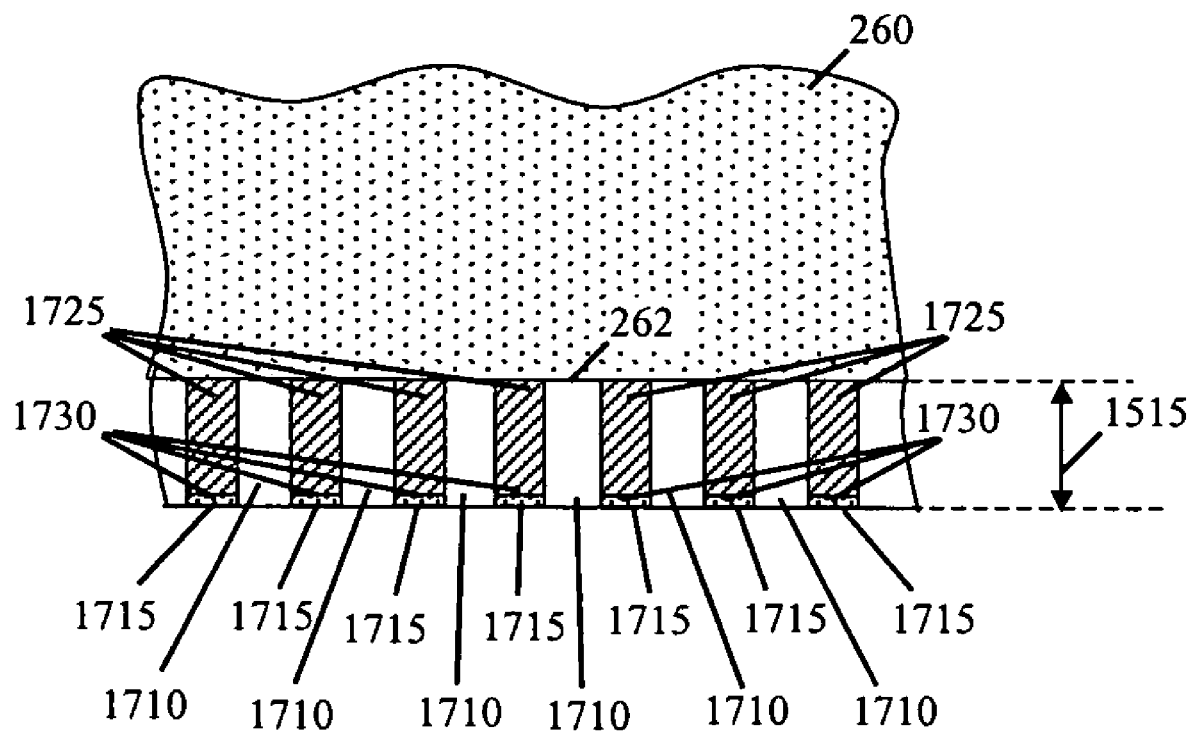

FIGS. 17-20 illustrate implementations of phase shifters, such as phase shifters 1505, 1510, that are engineered to cause interference effects that improve the quality of features printed with mask 215. FIGS. 17 and 18 show an implementation of a portion of a single phase shifter. FIG. 17 shows an implementation of such a phase shifter from below, while FIG. 18 shows the same implementation of phase shifter along section 18-18.

The illustrated phase shifter includes a checkerboard pattern 1705. Checkerboard pattern 1705 includes a collection of columnar features 1715 that together define a collection of holes 1710. Columnar features 1715 can be formed by depositing thin film materials that are partially or substantially opaque to radiation 230 on bottom surface 262 of mask 215. Features 1715 can be formed to have a thickness 1515 so that features 1715 are partially or substantially opaque to radiation 230 in the direction of thickness 1515. For example, features 1715 can be formed using evaporation, sputtering, and/or electroless thin film deposition techniques followed by patterning to define holes 1710. In one implementation, features 1715 include a metal, such as a chrome layer 1725, and an antireflective coating layer, such as a chrome oxide layer 1730.

Figure 19:
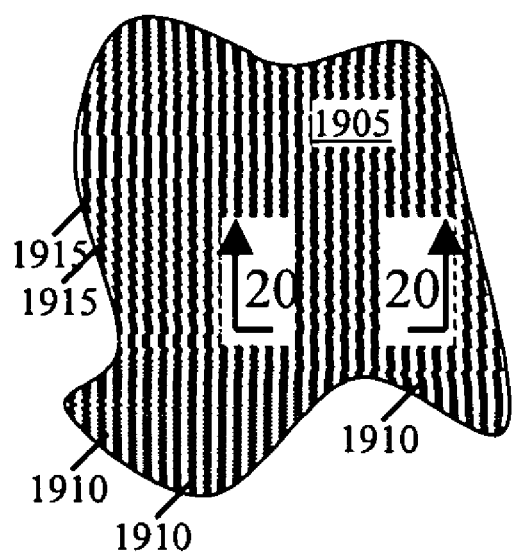
Figure 20:
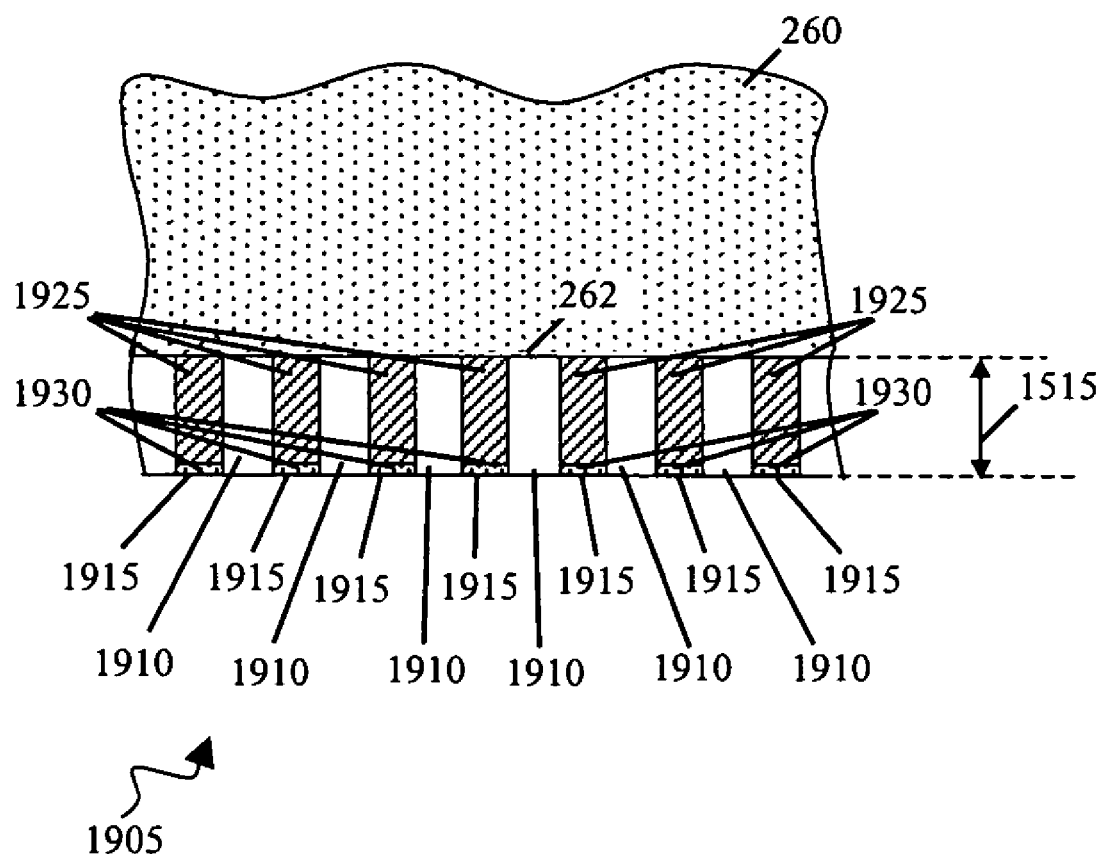

FIGS. 19 and 20 show another implementation of a portion of a single phase shifter, such as either of phase shifters 1505, 1510. FIG. 19 shows a view of the phase shifter from below, while FIG. 20 shows the same implementation of phase shifter along section 20-20. The illustrated phase shifter 1505 includes a grating pattern 1905. Grating pattern 1905 includes a collection of line features 1915 that define a collection of trenches 1910.

Line features 1915 can be formed by depositing thin film materials that are partially or substantially opaque to radiation 230 on bottom surface 262 of mask 215. Features 1915 can be formed to have a thickness 1515 sufficient that features 1915 are partially or substantially opaque to radiation 230 in the direction of thickness 1515. For example, features 1915 can be formed using evaporation, sputtering, and/or electroless thin film deposition techniques followed by patterning to define trenches 1910. In one implementation, features 1915 include a metal, such as a chrome layer 1925, and an antireflective coating layer, such as a chrome oxide layer 1930.

Figure 21:
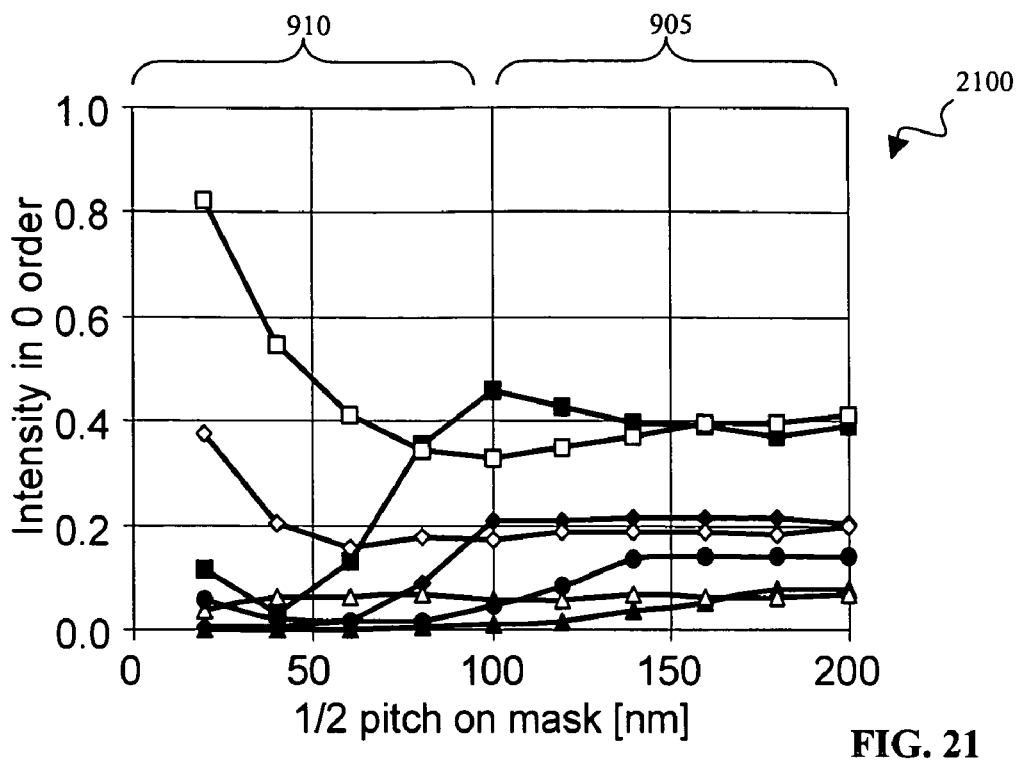
FIGS. 21, 22, and 23 illustrate how phase shifters can be tailored.
Figure 23:
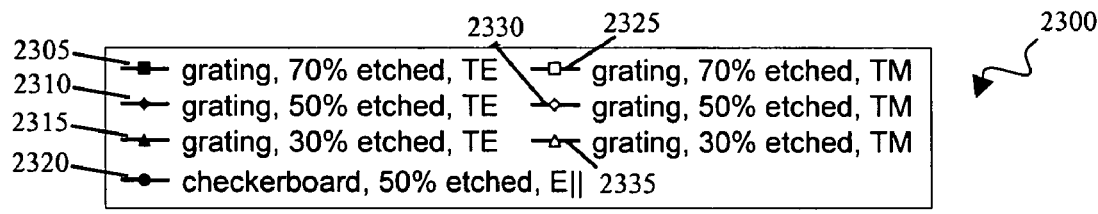
Figure 22:
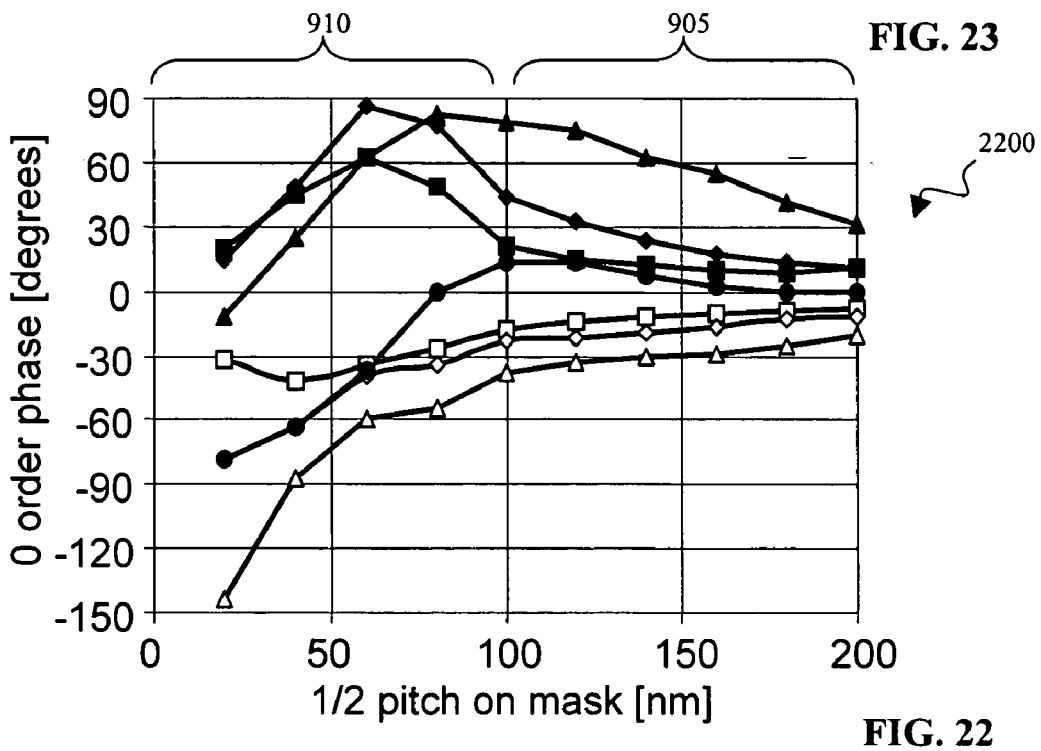

The layout of holes 1710, trenches 1910, and features 1715, 1915 can be selected to cause the desired interference effects and improve the quality of features printed with mask 215. FIGS. 21, 22, and 23 illustrate how to select the layout of holes 1710, trenches 1910, and features 1715, 1915 when thickness 1515 is 100 nm.

FIG. 21 shows a graph 2100 of the normalized zero diffraction order intensity of transmitted 193-nm radiation for a variety of phase shifters based on patterns 1705, 1905 as a function of one half the pitch of the phase shifters. In graph 2100, the zero diffraction order intensity is normalized by the clear field intensity and the pitch of patterns 1705, 1905 is expressed in nanometers.

FIG. 22 shows a graph 2200 of the zero diffraction order phase of transmitted 193-nm radiation for a variety of phase shifters based on patterns 1705, 1905 as a function of one half the pitch of the phase shifter. In graph 2200, the zero diffraction order phase is expressed in degrees and the pitch of patterns 1705, 1905 is expressed in nanometers. Graphs 2100 and 2200 both include a scattering region 905 and an averaging region 910.

FIG. 23 shows a key 2300 to graphs 2100, 2200. Key 2300 indicates that graphs 2100, 2200 include lines 2305, 2310, 2315, 2320, 2325, 2330, 2335. Line 2305 corresponds to a grating pattern 1905 where the width of trenches 1910 is 70% of the pitch of the grating pattern 1905 and where trenches 1910 are oriented parallel to the electric field of polarized incident radiation. Line 2310 corresponds to a grating pattern 1905 where the width of trenches 1910 is 50% of the pitch of the grating pattern 1905 and where trenches 1910 are oriented parallel to the electric field of polarized incident radiation. Line 2315 corresponds to a grating pattern 1905 where the width of trenches 1910 is 30% of the pitch of the grating pattern 1905 and where trenches 1910 are oriented parallel to the electric field of polarized incident radiation.

Line 2320 corresponds to a checkerboard pattern 1705 where the width of holes 1710 is 50% of the pitch of the checkerboard pattern 1705 and where the electric field of transmitted radiation has substantially the same polarization as the electric field of the incident radiation.

Line 2325 corresponds to a grating pattern 1905 where the width of trenches 1910 is 70% of the pitch of the grating pattern 1905 and where trenches 1710 are oriented parallel to the magnetic field of polarized incident radiation. Line 2330 corresponds to a grating pattern 1905 where the width of trenches 1910 is 50% of the pitch of the grating pattern 1905 and where trenches 1910 are oriented parallel to the magnetic field of polarized incident radiation. Line 2335 corresponds to a grating pattern 1905 where the width of trenches 1910 is 30% of the pitch of the grating pattern 1905 and where trenches 1910 are oriented parallel to the magnetic field of polarized incident radiation.

The transmission of radiation by phase shifters can be tailored to improve the quality of printing by selecting appropriate features for inclusion in the phase shifters. Two or more classes of features that yield different phase shifts and different intensities can be identified. The identified classes of features can be incorporated into a single mask. The different phase shifts and intensities can be achieved with different phase shifters formed from a single thin film to produce a multiphase mask. Further, the polarization of radiation can be controlled to provide additional control over the transmission characteristics of the phase shifters, depending on the inclusion of polarizing and/or non-polarizing features in the mask. A single mask having both strong phase shifting regions and weak phase shifting regions can be formed. A wide range of phase shifts and attenuations can be achieved with simplified processing that reduces overlay and processing requirements.

Figure 24:
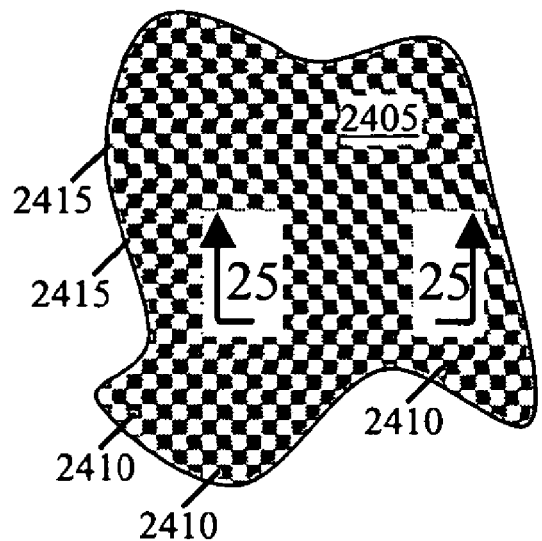
FIGS. 24 and 25 show an implementation of a portion of a phase shifter.
Figure 25:
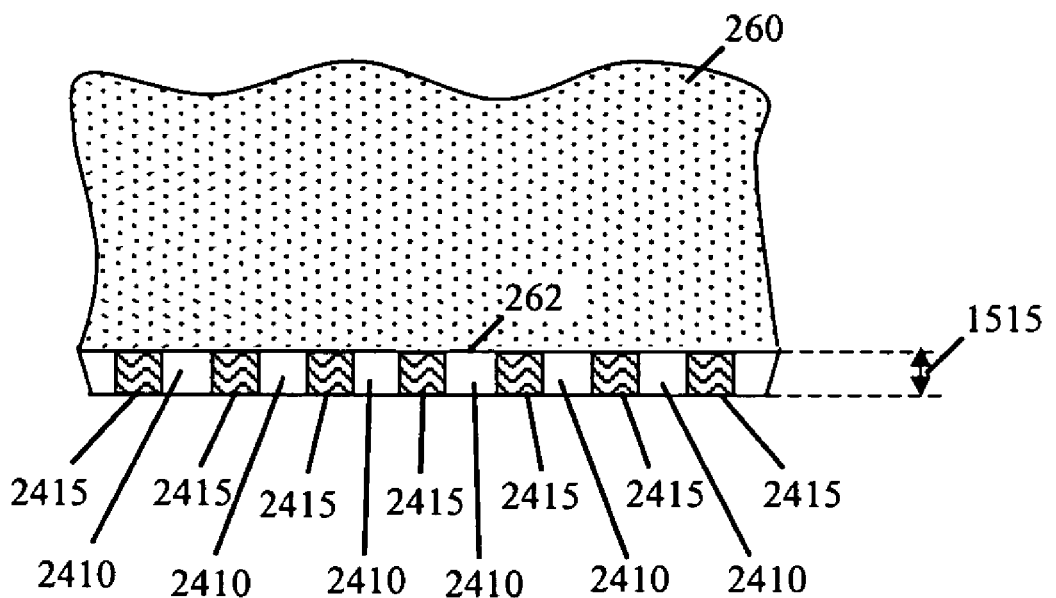

FIGS. 24 and 25 show another implementation of a portion of a single phase shifter, such as either of phase shifters 1505, 1510. FIG. 24 shows a view of the phase shifter from below, while FIG. 25 shows the same phase shifter along section 25-25.

The illustrated phase shifter includes a checkerboard pattern 2405. Checkerboard pattern 2405 includes a collection of columnar features 2415 that together define a collection of holes 2410. Columnar features 2415 can have a thickness 1515 and extend downward from the level of bottom surface 262 of mask 215. Columnar features 2415 can be formed of materials that reduce the intensity of transmitted radiation while simultaneously changing the phase relationship of the reduced intensity radiation relative to other radiation. Columnar features 2415 can be formed using a variety of thin film deposition techniques and can include, e.g., chrome, $Cr_xO_y$, $Cr_xO_yN_z$, $Mo_xSi_yO_z$, or $Mo_xSi_yO_zN_q$.

Figure 26:
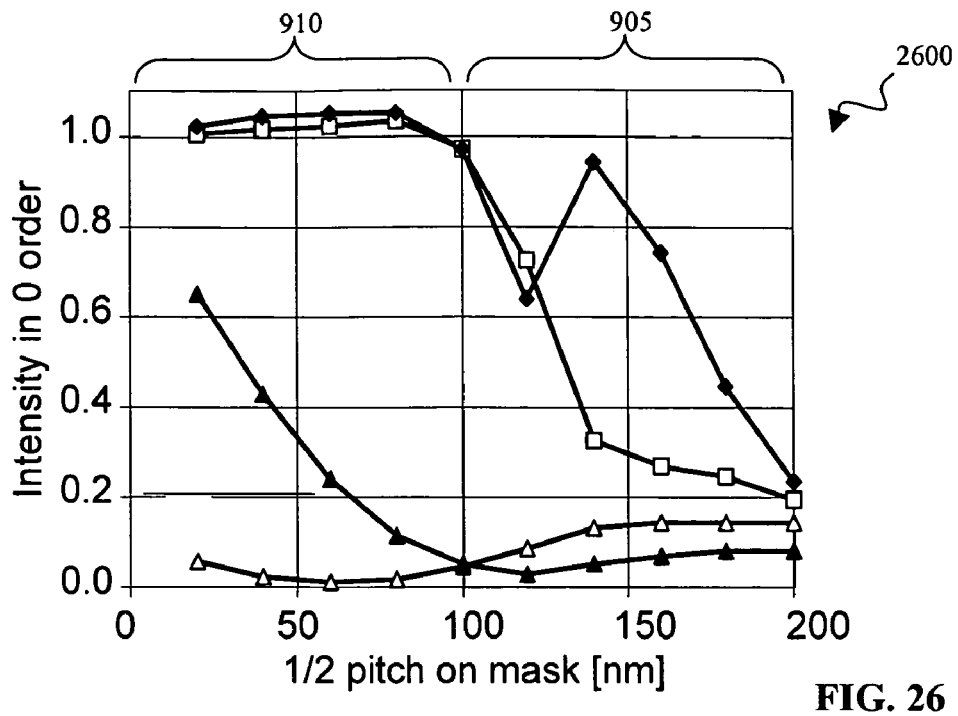
FIGS. 26, 27, and 28 illustrate how phase shifters can be tailored.
Figure 28:
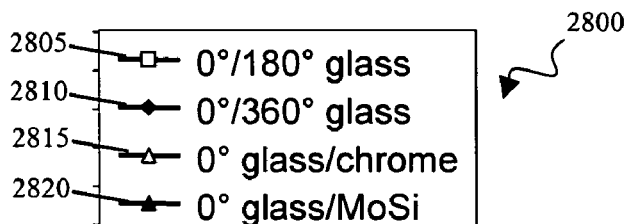
Figure 27:
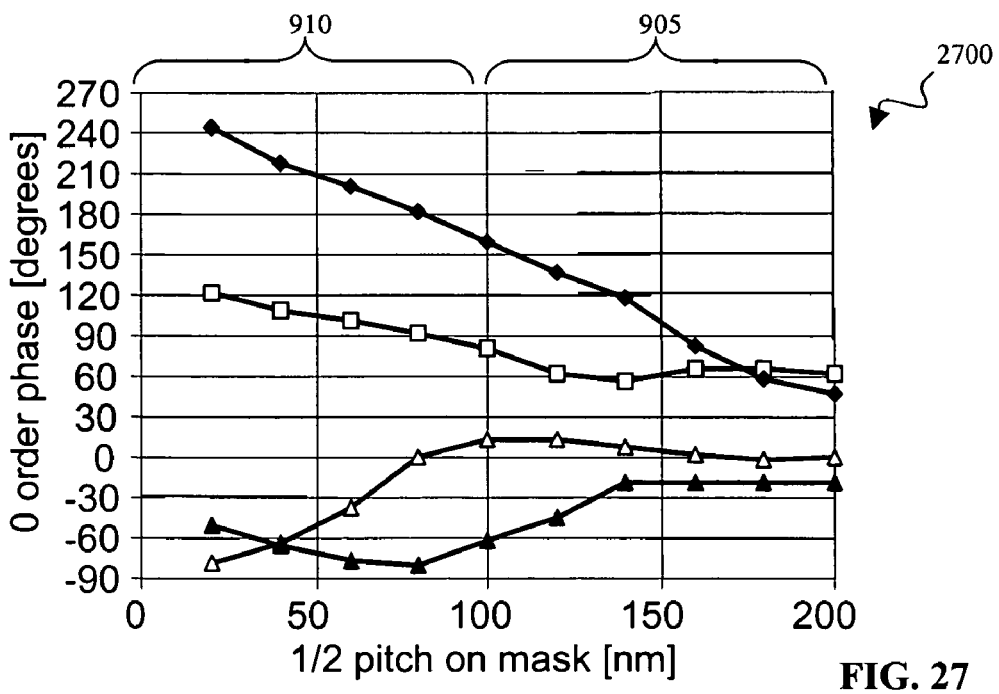

The layout of holes 510, 1710, 2410 and features 515, 1715, 2415 can be selected to cause the desired interference effects and improve the quality of features printed with mask 215. FIGS. 26, 27, and 28 illustrate how to select the layout of holes 510, 1710, 2410 and features 515, 1715, 2415.

FIG. 26 shows a graph 2600 of the normalized zero diffraction order intensity of transmitted 193-nm radiation for a variety of phase shifters based on patterns 505, 1705, 2405 as a function of one half the pitch of the phase shifters. In graph 2600, the zero diffraction order intensity is normalized by the clear field intensity and the pitch of patterns 505, 1705, 2405 is expressed in nanometers.

FIG. 27 shows a graph 2700 of the zero diffraction order phase of transmitted 193-nm radiation for a variety of phase shifters based on patterns 505, 1705, 2405 as a function of one half the pitch of the phase shifter. In graph 2700, the zero diffraction order phase is expressed in degrees and the pitch of patterns 505, 1705, 2405 is expressed in nanometers. Graphs 2600, 2700 both include a scattering region 905 and an averaging region 910.

FIG. 28 shows a key 2800 to graphs 2600, 2700. Key 2800 indicates that graphs 2600, 2700 include lines 2805, 2810, 2815, 2820. Line 2805 corresponds to a checkerboard pattern 505 where depth 315 is the 180° etch depth, the width of holes 510 is 50% of the pitch of the checkerboard pattern 505, and where the electric field of transmitted radiation has substantially the same polarization as the electric field of the incident radiation.

Line 2810 corresponds to a checkerboard pattern 505 where depth 315 is the 360° etch depth, the width of holes 510 is 50% of the pitch of the checkerboard pattern 505, and where the electric field of transmitted radiation has substantially the same polarization as the electric field of the incident radiation.

Line 2815 corresponds to a checkerboard pattern 1705 where the width of holes 1710 is 50% of the pitch of the checkerboard pattern 1705, and where the electric field of transmitted radiation has substantially the same polarization as the electric field of the incident radiation.

Line 2820 corresponds to a checkerboard pattern 2405 where the width of holes 2410 is 50% of the pitch of the checkerboard pattern 2405, and where the electric field of transmitted radiation has substantially the same polarization as the electric field of the incident radiation.

The transmission of radiation by phase shifters 305, 310, 1505, 1510 can be tailored to improve the quality of printing by selecting appropriate sub half-wavelength features for inclusion in the phase shifters.

Figure 29:
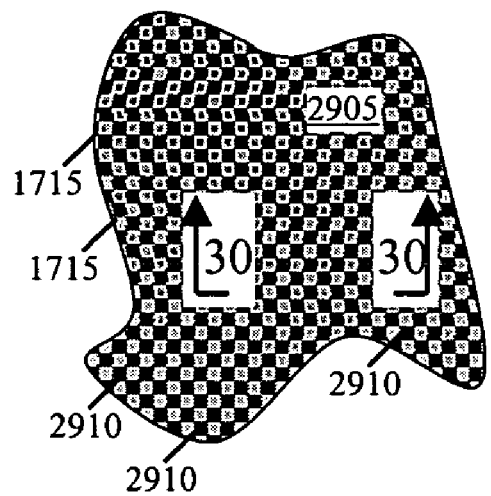
FIGS. 29 and 30 show an implementation of a portion of a phase shifter.
Figure 30:
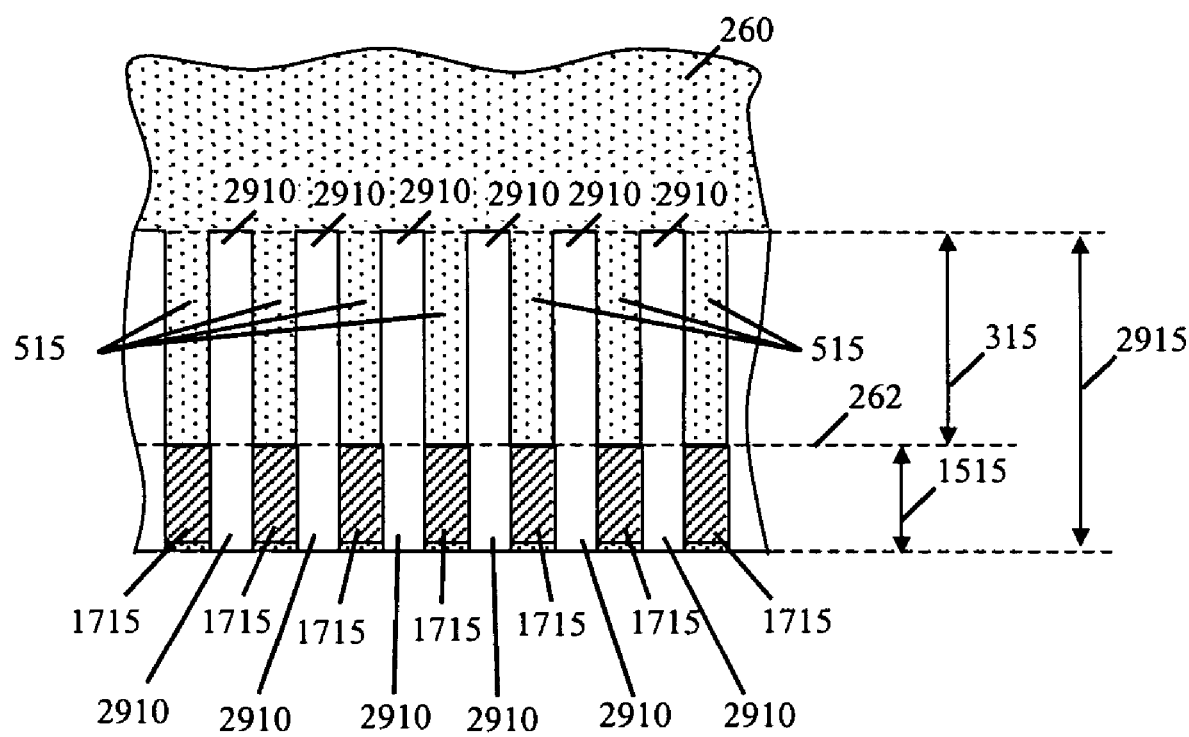

FIGS. 29 and 30 show another implementation of a portion of a single phase shifter. FIG. 29 shows a view of the phase shifter from below, while FIG. 30 shows the same phase shifter along section 30-30.

The illustrated phase shifter includes a checkerboard pattern 2905. Checkerboard pattern 2905 includes a collection of columnar features 1715 mounted on columnar features 515 that together define a collection of extended holes 2910. Columnar features 1715 can be partially or substantially opaque and can have a thickness 1515 extending from the level of surface 262. Columnar features 515 can be etched to depth 315 from the level of surface 262 into substrate 260. Depth 315 can be the 180° etch depth. Extended holes 2910 can thus have an extended length 2915 that is equal to the sum of thickness 1515 and depth 315 and that spans the level of surface 262.

Figure 31:
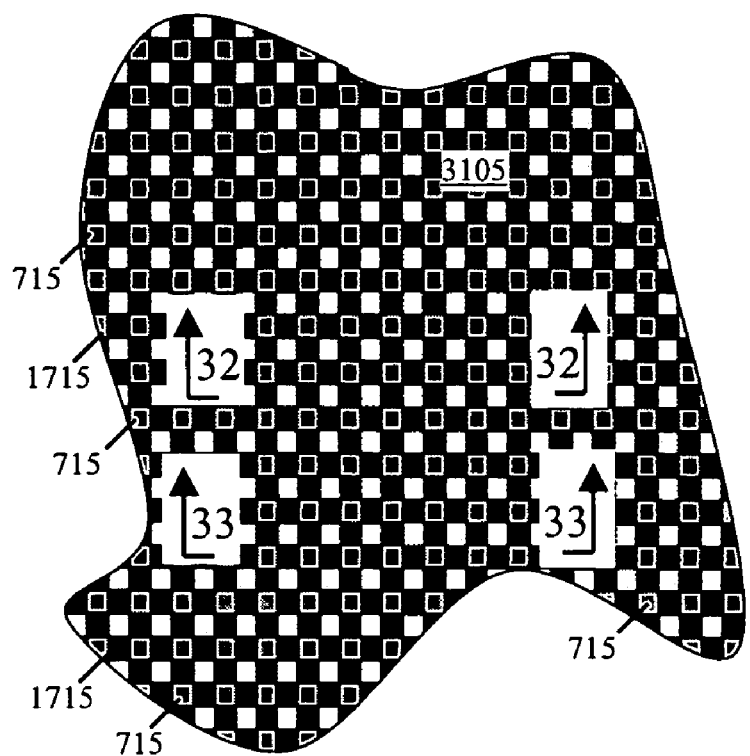
FIGS. 31, 32 and 33 show an implementation of a portion of a phase shifter.
Figure 32:
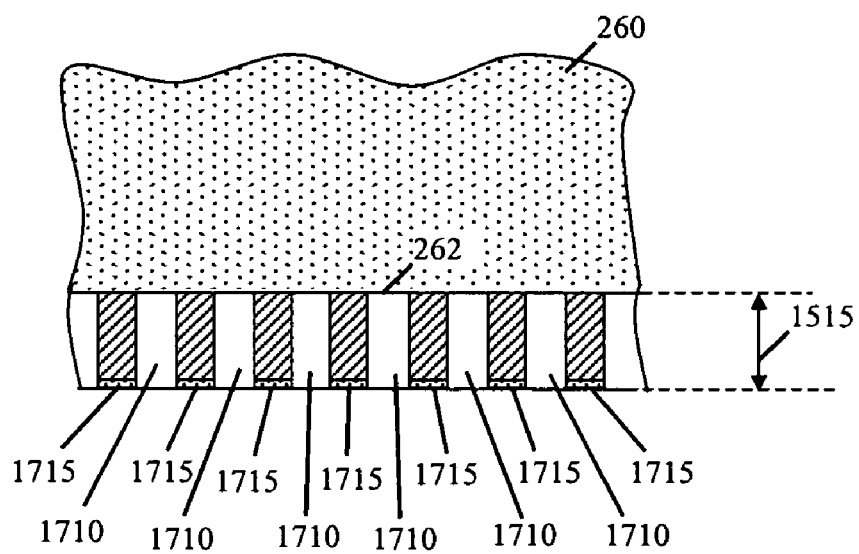
Figure 33:
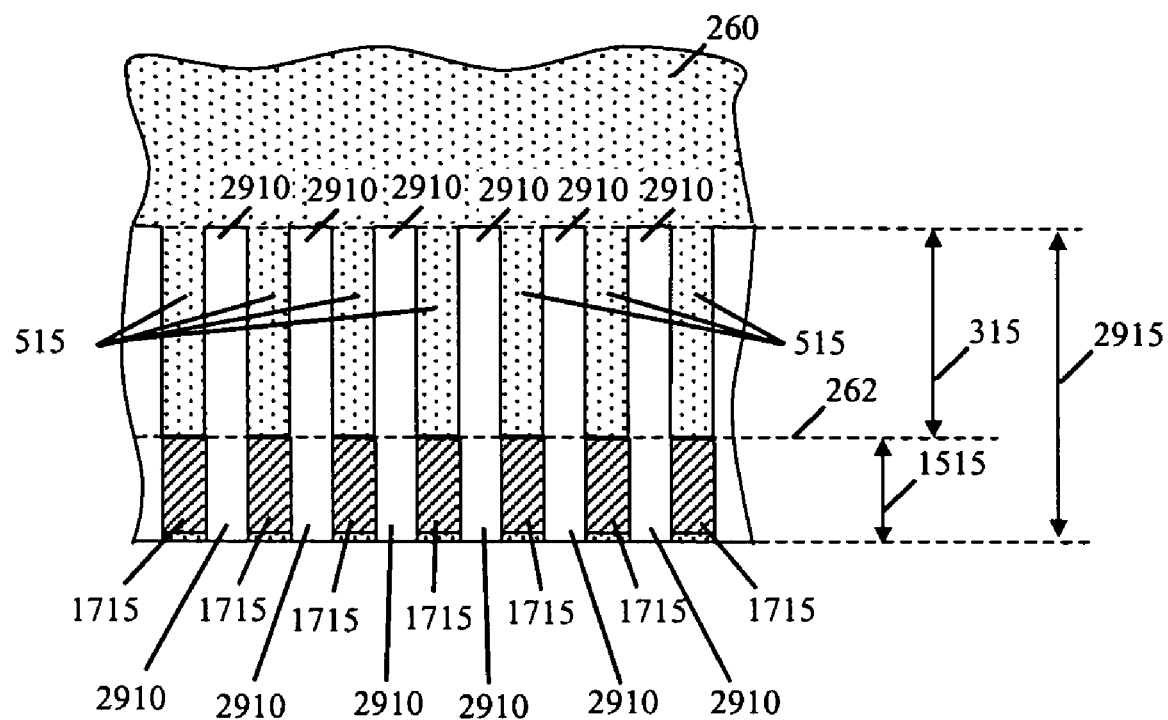

FIGS. 31, 32, and 33 show another implementation of a portion of a single phase shifter. FIG. 31 shows a view of the phase shifter from below, while FIGS. 32 and 33 show the same phase shifter along section 32-32 and section 33-33, respectively.

The illustrated phase shifter includes a multi-element pattern 3105. A multi element pattern is a pattern that includes three or more distinct categories of features in a single phase shifter. Multi element pattern 3105 includes a repeating arrangement of columnar features 1715 and columnar features 515. A portion of the collection of columnar features 1715 are mounted on columnar features 515 so that a collection of holes 1710 and a collection of extended holes 2910 are defined.

Figure 34:
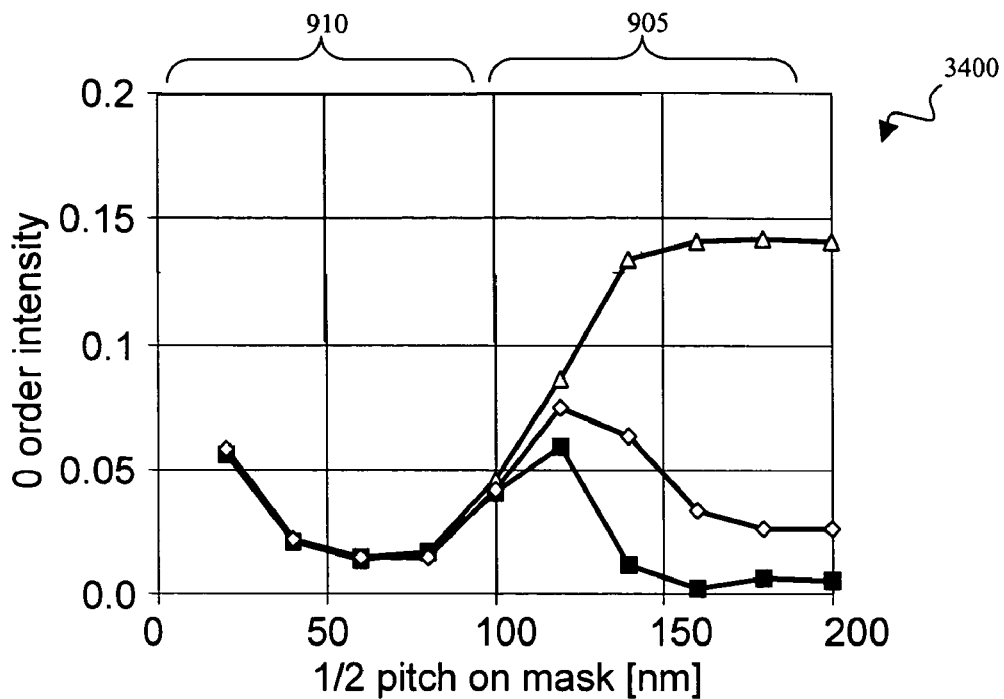
FIGS. 34, 35, and 36 illustrate how phase shifters can be tailored.
Figure 36:
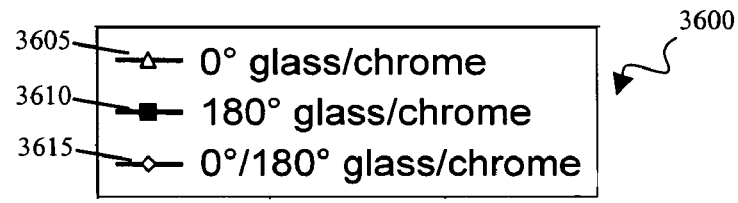
Figure 35:
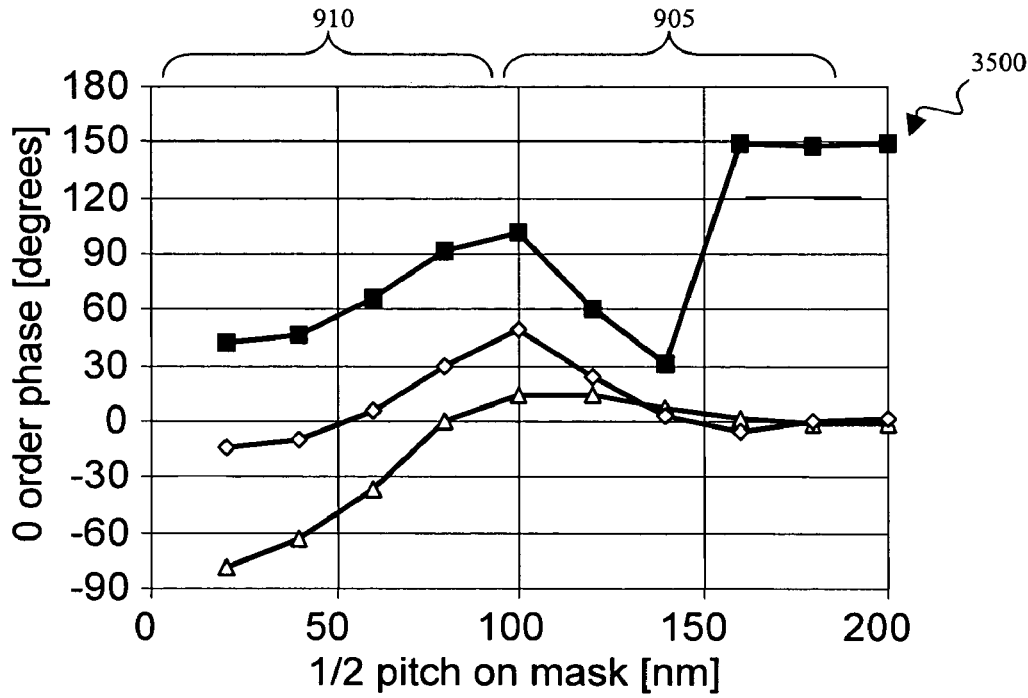

The layout of holes 1710, 2910 and features 515, 1715 can be selected to cause the desired interference effects and improve the quality of features printed with mask 215. FIGS. 34, 35, and 36 illustrate how to select the layout of holes 1710 and features 1715 in checkerboard pattern 1705, the layout of holes 2910 and features 515, 1715 in checkerboard pattern 2905, and the layout of holes 1710, 2910 and features 515, 1715 in multi element pattern 3105.

FIG. 34 shows a graph 3400 of the normalized zero diffraction order intensity of transmitted 193-nm radiation for a variety of phase shifters based on patterns 1705, 2905, 3105 as a function of one half the pitch of the phase shifters. In graph 3400, the zero diffraction order intensity is normalized by the clear field intensity and the pitch of patterns 1705, 2405, 3105 is expressed in nanometers.

FIG. 35 shows a graph 3500 of the zero diffraction order phase of transmitted 193-nm radiation for a variety of phase shifters based on patterns 1705, 2905, 3105 as a function of one half the pitch of the phase shifter. In graph 3500, the zero diffraction order phase is expressed in degrees and the pitch of patterns 1705, 2905, 3105 is expressed in nanometers. Graphs 3400, 3500 both include a scattering region 905 and an averaging region 910.

FIG. 36 shows a key 3600 to graphs 3400, 3500. Key 3600 indicates that graphs 3400, 3500 include lines 3605, 3610, 3615. Line 3605 corresponds to a checkerboard pattern 1705 where depth 315 is the 360° etch depth, the width of holes 1710 is 50% of the pitch of the checkerboard pattern 1705, and where the electric field of transmitted radiation has substantially the same polarization as the electric field of the incident radiation.

Line 3610 corresponds to a checkerboard pattern 2905 where depth 315 is the 180° etch depth, thickness 1515 is 100 nm, the width of features 515, 1715 is 50% of the pitch of the checkerboard pattern 2905, and where the electric field of transmitted radiation has substantially the same polarization as the electric field of the incident radiation.

Line 3615 corresponds to a multi-element pattern 3105 where depth 315 is the 180° etch depth, thickness 1515 is 100 nm, the width of features 515, 1715 is 50% of the pitch of pattern 3105, and where the electric field of transmitted radiation has substantially the same polarization as the electric field of the incident radiation.

The transmission of radiation by phase shifters 305, 310, 1505, 1510 can be tailored to improve the quality of printing by selecting appropriate features for inclusion in the phase shifters.

Figure 37:
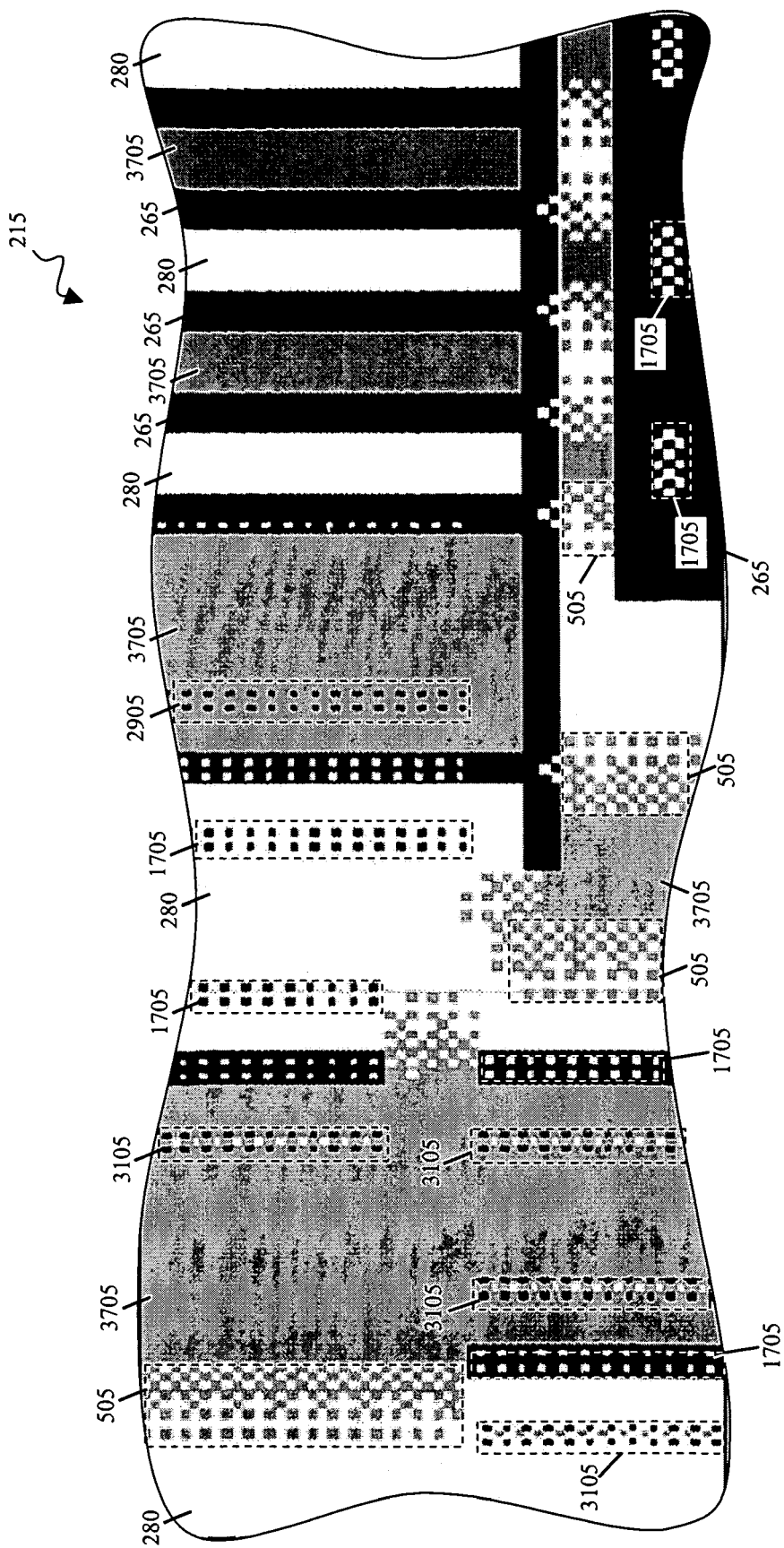
FIG. 37 shows an implementation of a portion of a mask.
Figure 38:
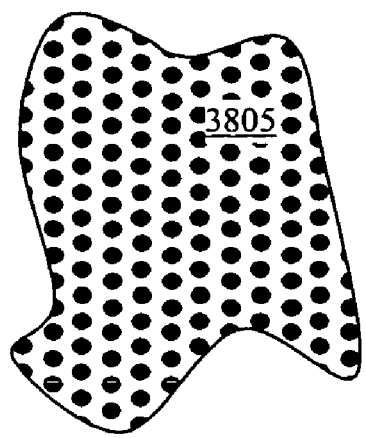
FIGS. 38-43 show implementations of portions of phase shifters.
Figure 39:
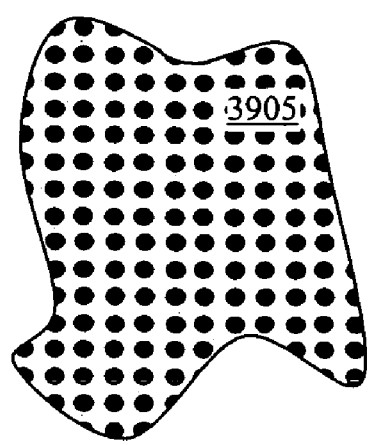
Figure 40:
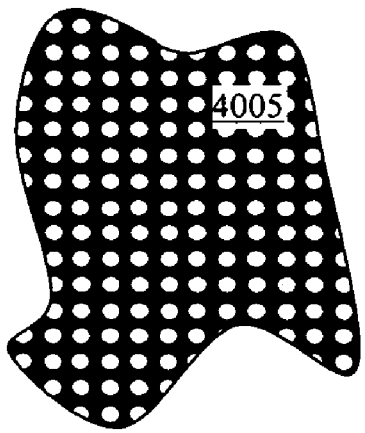
Figure 41:
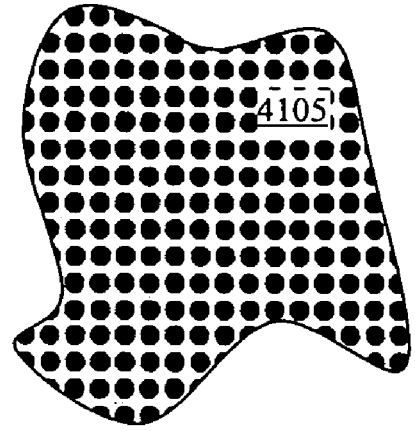
Figure 42:
Figure 43:
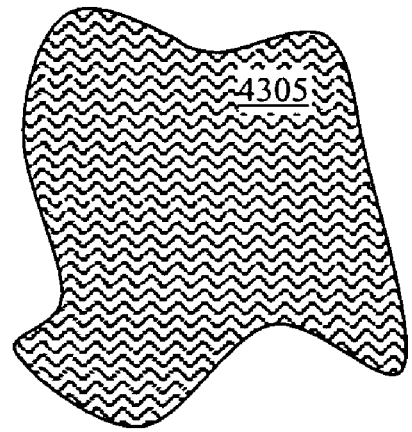

FIG. 37 shows an implementation of a portion of a mask 215 from below. The implementation shown in FIG. 37 can be made using a single absorber etch and a single substrate (e.g., glass) etch to form phase shifters 270, 275 that both extend into substrate 260 and extend beyond the level of surface 262 of substrate 260. Thus, two etch operations (substrate and absorber) can form three distinct categories of features on mask 215, namely those features that extend into mask substrate 260 (e.g., to the 180° or other etch depth), those features that are at the level of surface 262 of substrate 260, and those features that extend beyond the level of surface 262 of substrate 260. These three distinct categories of features can, however, provide regions with a transmissivity and phase shift tailored to improve the quality of lithographic printing.

For a given electromagnetic radiation and photolithography system, mask 215 can include features that are resolved by the photolithography system as well as features that fall within one or both of regions 905, 910. The resolved features can include a collection of opaque areas 265 that block the transmission of radiation, a collection of phase shift regions 280, and a collection of phase shifters 3705. Phase shifters 3705 can be formed by etching substrate 260 to substantially the same etch depth 315 as other features that fall within regions 905, 910. For example, phase shifters 3705 can be etched to the 180° etch depth.

Mask 215 also includes features that fall within regions 905, 910. The features that fall within regions 905, 910 can form one or more of multi-element pattern 3105 and checkerboard patterns 505, 1705, 2905. Mask 215 can also include additional features that fall within regions 905, 910 but do not form one or more of patterns 3105, 505, 1705, 2905. For example, grating patterns can be formed (not shown) and scattering or averaged features can be formed in isolation or distributed in other patterns.

Resolved features and features that fall within regions 905, 910 can be arranged and dimensioned on mask 215 to achieve the described phase shifting and intensity attenuation effects and improve the quality of printing. The phase and intensity of radiation transmitted through different regions of mask 215 can be modulated with features formed using a minimal amount of additional processing. The phase and intensity modulations can be tailored to achieve a variety of ends, such as smooth phase transitions between different regions of mask 215. Both strong and weak phase shifting regions can be incorporated into a single mask.

A number of implementations have been described. Nevertheless, it will be understood that various modifications may be made. For example, FIGS. 38-43 show additional views of portions of phase shifters from below. The phase shifters each include features formed by etching at least one of a substrate and an absorber. The phase shifters each include a different pattern 3805, 3905, 4005, 4105, 4205, 4305. For a given radiation 230, patterns 3805, 3905, 4005, 4105, 4205, 4305 can be selected to include features dimensioned to be within scattering region 905 and/or within averaging region 910. Multi-element implementations that include three or more distinct categories of features in a single phase shifter can also be formed. Masks can include regions that do not shift the phase of transmitted radiation but instead attenuate the transmitted regions to differing extents can be formed. The geometry and dimensions of the mask features can be selected and used to tailor radiation interference effects to improve the quality of the printing.

Additional patterns and features, including those combining the described patterns and features and/or characteristics of the described patterns and features, can also be selected and used to tailor radiation interference effects.

Figure 44:
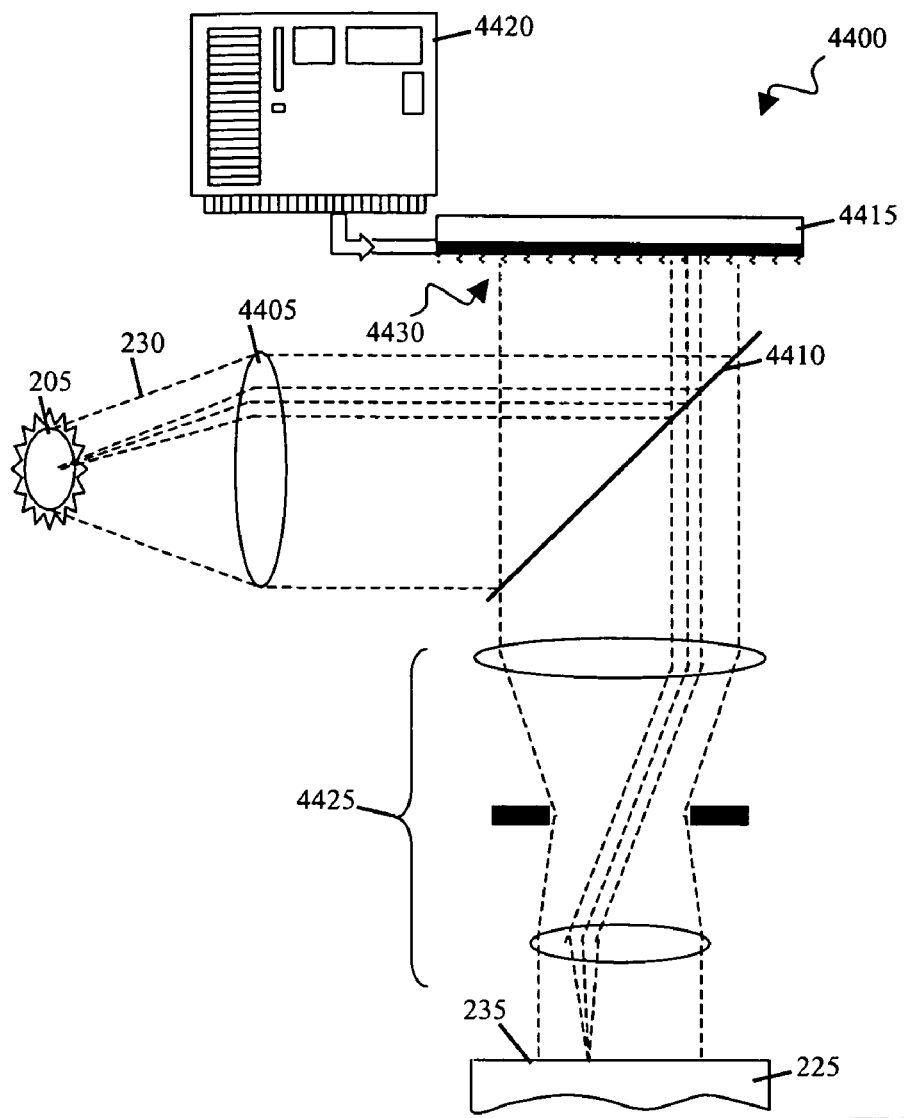
FIG. 44 shows a block diagram of a lithography system that includes a programmable device.

Subwavelength features can also be used in devices other than masks to pattern microelectronic devices. For example, programmable devices such as micro electro-mechanical system (MEMS) arrays of reflective elements can include sub-wavelength features and achieve desirable results. FIG. 44 shows a lithography system 4400 that includes and example of such a programmable device. System 4400 includes an illumination source 205, an illumination system 4405, a beam splitter 4410, a programmable optical device 4415, a device controller 4420, projection optics 4425, and a substrate 225.

Illumination system 4405 can collect, collimate, filter, and/or focus radiation 230 emitted from source 205 to illuminate beam splitter 4410. Beam splitter 4410 can direct at least a portion of the radiation from illumination system 4405 to programmable element 4415. As discussed further below, programmable device 4415 can be programmed by element controller 4420 to influence the incidence of radiation 230 upon substrate 225 for the formation of microelectronic devices. Device 4415 can include a surface 4430 that includes elements that influence the intensity and phase of reflected electromagnetic radiation.

Beam splitter 4410 can allow at least a portion of the radiation from programmable device 4415 to pass to projection optics 4425 and substrate 225 so that working surface 235 of substrate 225 can be patterned by system 4400. For example, beam splitter 4410 can be a polarizing or a nonpolarizing beam splitter cube or a beamsplitter plate.

Figure 45:
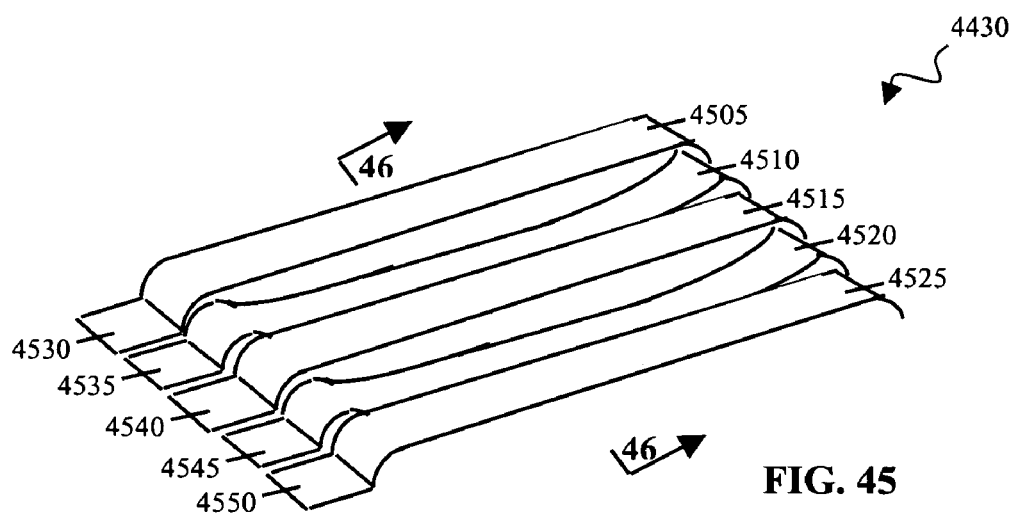
FIGS. 45 and 46 show an implementation of a programmable device.
Figure 46:
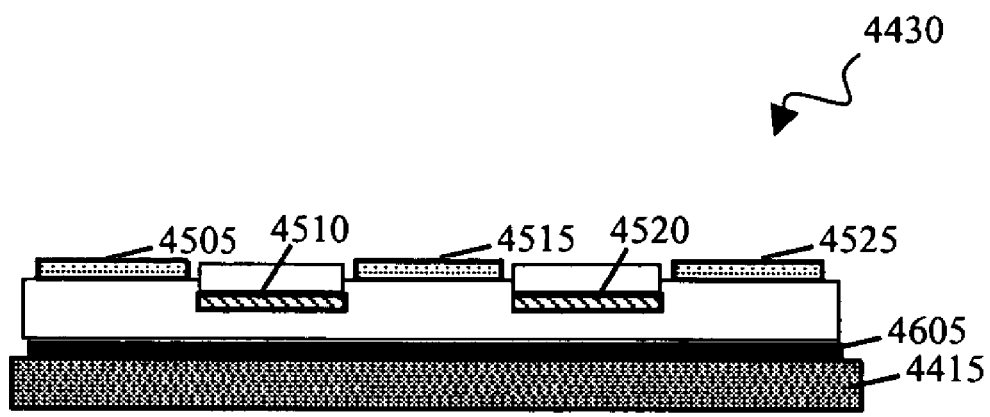

As shown in FIGS. 45 and 46, one implementation of surface 4430 of programmable device 4415 can include a collection of dynamic elements 4505, 4510, 4515, 4520, 4525 mounted above a conductive plate 4605 on device 4415. Dynamic elements 4505, 4510, 4515, 4520, 4525 are subwavelength features in that they have a pitch dimension that is smaller than one wavelength of radiation 230. Each dynamic element 4505, 4510, 4515, 4520, 4525 includes a respective contact 4530, 4535, 4540, 4545, 4550. Dynamic elements 4505, 4510, 4515, 4520, 4525 are addressable through contacts 4530, 4535, 4540, 4545, 4550 to change the reflective properties of surface 4430.

In particular, in operation, dynamic elements 4505, 4510, 4515, 4520, 4525 can be dynamically repositioned to create one or more phase shifters patterns. Element controller 4420 can bias selected dynamic elements 4505, 4510, 4515, 4520, 4525 relative to conductive plate 4605 through contacts 4530, 4535, 4540, 4545, 4550. The applied potential can be sufficient to cause the selected elements 4505, 4510, 4515, 4520, 4525 to deflect and create one or more patterns that change the reflective properties of surface 4430.

Figure 47:
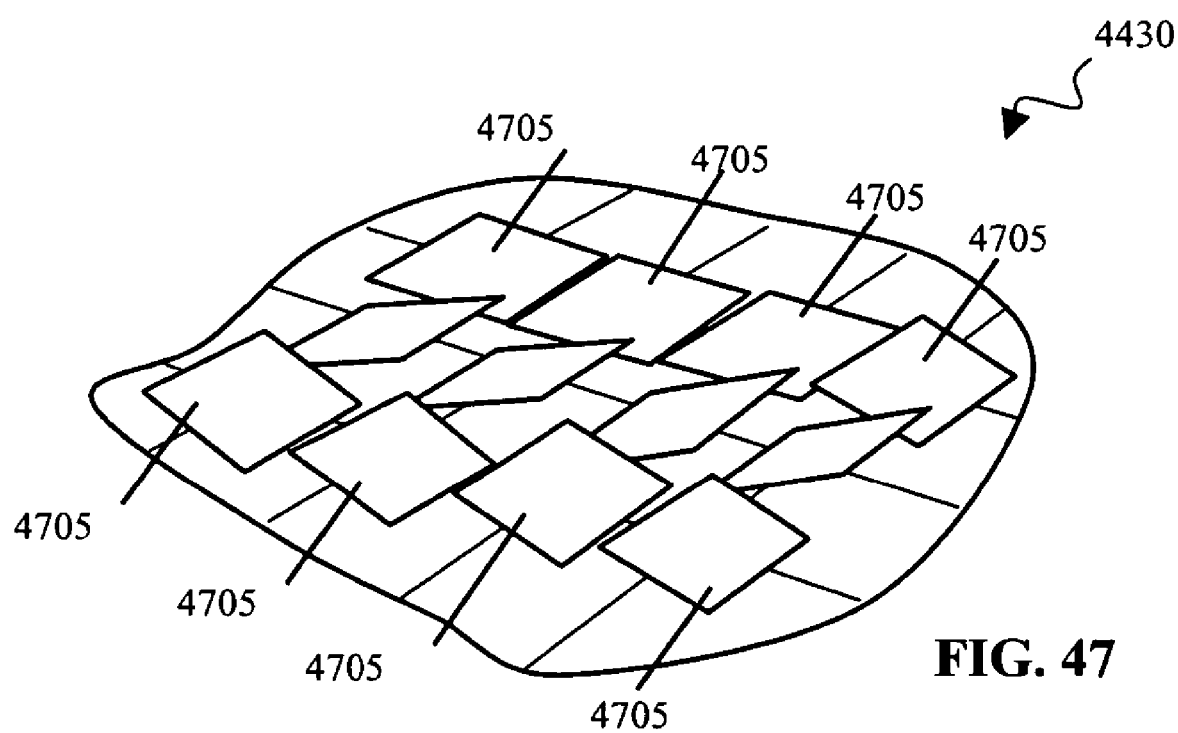
FIG. 47 shows another implementation of a programmable device.

FIG. 47 shows another implementation of surface 4430 of programmable device 4415. This implementation includes a collection of pixel elements 4705. Pixel elements 4705 are subwavelength features in that they have a pitch dimension that is smaller than one wavelength of radiation 230. Pixel elements 4705 are mounted on surface 4430 of device 4415 to be individually orientable by element controller 4420. In operation, programmed orientation of pixel elements 4705 can dynamically create one or more patterns that change the reflective properties of surface 4430.

Accordingly, other implementations are within the scope of the following claims.

What is claimed is:

1. A lithography mask comprising:
 a first phase shifter to shift a phase of zero diffraction order radiation for patterning of microelectronic devices to a first extent; and
 a second phase shifter to shift the phase of zero diffraction order radiation to a second extent,
 wherein the first phase shifter and the second phase shifter have a same etch depth, and the first extent differs from the second extent.

2. The mask of claim 1, wherein the first phase shifter region comprises sub-half wavelength features having a dimension smaller than one half of the wavelength of the radiation.

3. The mask of claim 1, wherein:
 the first phase shifter comprises a first collection of subwavelength features having a pitch dimension smaller than one wavelength of the radiation to pattern microelectronic devices; and
 the second phase shifter comprises a second collection of subwavelength features having a pitch dimension smaller than one wavelength, the second collection configured to transmit the zero diffraction order radiation with a different transmissivity and a different phase than the zero diffraction order radiation transmitted by the first phase shifter.

4. The mask of claim 1, wherein the first phase shifter comprises an alternating phase shifting region having two or more associated apertures.

5. The mask of claim 1, wherein the first phase shifter comprises a thin film material that changes a phase of the transmitted radiation.

6. The mask of claim 5, wherein the thin film material comprises one or more of chrome, CrxOy, CrxOyNz, MoxSiyOz, and MoxSiyOzNq.

7. The mask of claim 1, wherein the mask further comprises a third phase shifter including a collection of scattering features.

8. The mask of claim 1, wherein the mask comprises a transmission lithography mask.

9. The mask of claim 1, wherein the first phase shifter comprises a polarizing phase shifter.

10. The mask of claim 1, wherein:
the first phase shifter comprises first sub-half wavelength features that interact with the radiation as if the first phase shifter were a uniform whole;
the second phase shifter comprises second sub-half wavelength features that interact with the radiation as if the first phase shifter were a uniform whole.

11. The mask of claim 1, further comprising a mask substrate, the first phase shifter being etched into the mask substrate.

12. The mask of claim 1, further comprising an absorber material to attenuate the zero diffraction order of a radiation for patterning of microelectronic devices, the first phase shifter being etched into the absorber material.

13. The mask of claim 12, wherein the attenuating absorber comprises an opaque metal film.

14. The mask of claim 12, wherein the absorber material comprises an embedded phase shifter material that changes a phase of the attenuated radiation.

15. The lithography mask of claim 1, wherein the first phase shifter and the second phase shifter comprise first and second attenuating regions to attenuate the zero diffraction order radiation for patterning of microelectronic devices traveling through the mask to different amounts.

16. The mask of claim 15, wherein at least one of the attenuating regions includes a collection of sub-half wavelength features to attenuate the zero diffraction order radiation and shift the phase of the zero diffraction order radiation.

17. The mask of claim 15, wherein the number of attenuating regions is greater than a number of etch operations used to form the regions.

18. The mask of claim 1, wherein the first phase shifter is configured to modulate the phase of the zero diffraction order radiation to have a phase that is between about 126 degrees and about 54 degrees out of phase with the zero diffraction order radiation modulated by the second phase shifter.

19. The mask of claim 1, wherein the second phase shifter comprises a bulk mask substrate region.

* * * * *